(12) United States Patent
Yamazaki

(10) Patent No.: US 9,818,850 B2
(45) Date of Patent: Nov. 14, 2017

(54) MANUFACTURING METHOD OF THE SEMICONDUCTOR DEVICE

(71) Applicant: Semiconductor Energy Laboratory Co., Ltd., Atsugi-shi, Kanagwa-ken (JP)

(72) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/079,467

(22) Filed: Mar. 24, 2016

(65) Prior Publication Data

US 2016/0204232 A1 Jul. 14, 2016

Related U.S. Application Data

(63) Continuation of application No. 14/557,915, filed on Dec. 2, 2014, now Pat. No. 9,299,814, which is a (Continued)

(30) Foreign Application Priority Data

Jan. 12, 2011 (JP) ................................. 2011-004422

(51) Int. Cl.
*H01L 29/66* (2006.01)
*H01L 29/78* (2006.01)
(Continued)

(52) U.S. Cl.
CPC .. *H01L 29/66969* (2013.01); *H01L 21/02554* (2013.01); *H01L 21/02565* (2013.01);
(Continued)

(58) Field of Classification Search
CPC ..................... H01L 21/02414; H01L 29/7869
(Continued)

(56) References Cited

U.S. PATENT DOCUMENTS 4,313,768 A 2/1982 Sanders et al.
5,372,958 A 12/1994 Miyasaka et al.
(Continued)

FOREIGN PATENT DOCUMENTS

EP 0486047 A 5/1992
EP 1737044 A 12/2006
(Continued)

OTHER PUBLICATIONS

Coates.D et al., "Optical Studies of the Amorphous Liquid-Cholesteric Liquid Crystal Transition: The "Blue Phase"". Physics Letters, Sep. 10, 1973, vol. 45A, No. 2, pp. 115-116.
(Continued)

*Primary Examiner* — Moazzam Hossain
(74) *Attorney, Agent, or Firm* — Robinson Intellectual Property Law Office; Eric J. Robinson

(57) ABSTRACT

The semiconductor device is manufactured through the following steps: after first heat treatment is performed on an oxide semiconductor film, the oxide semiconductor film is processed to form an oxide semiconductor layer; immediately after that, side walls of the oxide semiconductor layer are covered with an insulating oxide; and in second heat treatment, the side surfaces of the oxide semiconductor layer are prevented from being exposed to a vacuum and defects (oxygen deficiency) in the oxide semiconductor layer are reduced.

8 Claims, 21 Drawing Sheets

Related U.S. Application Data continuation of application No. 13/345,903, filed on Jan. 9, 2012, now Pat. No. 8,912,080.

(51) Int. Cl.
*H01L 21/477* (2006.01)
*H01L 21/02* (2006.01)
*H01L 29/786* (2006.01)

(52) U.S. Cl.
CPC ...... *H01L 21/02631* (2013.01); *H01L 21/477* (2013.01); *H01L 29/7869* (2013.01); *H01L 29/78648* (2013.01)

(58) Field of Classification Search
USPC .......................................................... 438/104
See application file for complete search history.

(56) References Cited

U.S. PATENT DOCUMENTS

| | | | |
|---|---|---|---|
| 5,504,019 A | 4/1996 | Miyasaka et al. | |
| 5,528,032 A | 6/1996 | Uchiyama | |
| 5,591,989 A | 1/1997 | Miyasaka et al. | |
| 5,637,512 A | 6/1997 | Miyasaka et al. | |
| 5,731,856 A | 3/1998 | Kim et al. | |
| 5,744,864 A | 4/1998 | Cillessen et al. | |
| 5,811,323 A | 9/1998 | Miyasaka et al. | |
| 6,087,208 A | 7/2000 | Krivokapic et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,740,927 B1 | 5/2004 | Jeng | |
| 7,005,717 B2 * | 2/2006 | Eisenbeiser ....... H01L 21/28194 257/410 | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,198,968 B2 | 4/2007 | Chae et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,341,899 B2 | 3/2008 | Huang | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,615,488 B2 | 11/2009 | Maekawa et al. | |
| 7,674,650 B2 | 3/2010 | Akimoto et al. | |
| 7,732,819 B2 | 6/2010 | Akimoto et al. | |
| 7,838,328 B2 | 11/2010 | Isa | |
| 8,049,225 B2 | 11/2011 | Yamazaki et al. | |
| 8,093,589 B2 | 1/2012 | Sugihara et al. | |
| 8,110,436 B2 | 2/2012 | Hayashi et al. | |
| 8,134,151 B2 | 3/2012 | Imai | |
| 8,143,115 B2 | 3/2012 | Omura et al. | |
| 8,148,721 B2 | 4/2012 | Hayashi et al. | |
| 8,183,099 B2 | 5/2012 | Sakata | |
| 8,193,045 B2 | 6/2012 | Omura et al. | |
| 8,253,905 B2 | 8/2012 | Lu et al. | |
| 8,338,226 B2 * | 12/2012 | Asano ............... H01L 29/78618 257/E29.296 | |
| 8,450,144 B2 | 5/2013 | Sakata et al. | |
| 8,629,432 B2 | 1/2014 | Sakata et al. | |
| 8,785,242 B2 | 7/2014 | Yamazaki et al. | |
| 8,803,149 B2 | 8/2014 | Sakata | |
| 8,884,287 B2 | 11/2014 | Sakata et al. | |
| 9,105,659 B2 | 8/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0023622 A1 | 2/2005 | Eisenbeiser et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0160281 A1 | 7/2006 | Huang | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0277663 A1 | 11/2008 | Kang et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0267048 A1 * | 10/2009 | Nakahara ................ H01L 33/20 257/13 | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117075 A1 * | 5/2010 | Akimoto ........... H01L 29/66742 257/43 | |

(56) References Cited

U.S. PATENT DOCUMENTS

| | | | |
|---|---|---|---|
| 2010/0123131 A1* | 5/2010 | Tokunaga | H01L 29/41733 257/43 |
| 2010/0200851 A1 | 8/2010 | Oikawa et al. | |
| 2010/0224872 A1* | 9/2010 | Kimura | H01L 27/1214 257/43 |
| 2010/0233847 A1 | 9/2010 | Ohara et al. | |
| 2010/0252827 A1 | 10/2010 | Asano et al. | |
| 2011/0031499 A1 | 2/2011 | Kimura et al. | |
| 2011/0147737 A1 | 6/2011 | Yamazaki et al. | |
| 2011/0156023 A1 | 6/2011 | Ieda | |
| 2011/0175090 A1 | 7/2011 | Sugihara et al. | |
| 2011/0193079 A1 | 8/2011 | Endo et al. | |
| 2012/0132908 A1 | 5/2012 | Sugihara et al. | |
| 2012/0168750 A1 | 7/2012 | Hayashi et al. | |
| 2012/0175608 A1 | 7/2012 | Yamazaki | |
| 2012/0175609 A1 | 7/2012 | Yamazaki | |
| 2012/0175610 A1 | 7/2012 | Yamazaki | |
| 2012/0175625 A1 | 7/2012 | Yamazaki | |
| 2012/0178224 A1 | 7/2012 | Yamazaki | |
| 2014/0014951 A1* | 1/2014 | Kawashima | H01L 29/41733 257/43 |
| 2015/0037912 A1 | 2/2015 | Sakata | |
| 2015/1008404 | 3/2015 | Hayashi et al. | |

FOREIGN PATENT DOCUMENTS

| | | |
|---|---|---|
| EP | 2157615 A | 2/2010 |
| EP | 2226972 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-373902 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2007-096055 A | 4/2007 |
| JP | 2007-123861 A | 5/2007 |
| JP | 2007-220818 A | 8/2007 |
| JP | 2008-166716 A | 7/2008 |
| JP | 2009-010362 A | 1/2009 |
| JP | 2009-076877 A | 4/2009 |
| JP | 2009-099953 A | 5/2009 |
| JP | 2009-224479 A | 10/2009 |
| JP | 2009-224737 A | 10/2009 |
| JP | 2010-045263 A | 2/2010 |
| JP | 2010-062548 A | 3/2010 |
| JP | 2010-074138 A | 4/2010 |
| JP | 2010-166030 A | 7/2010 |
| JP | 2010-186994 A | 8/2010 |
| JP | 2010-212436 A | 9/2010 |
| JP | 2010-251731 A | 11/2010 |
| WO | WO-2004/114391 | 12/2004 |
| WO | WO-2008/069056 | 6/2008 |
| WO | WO-2008/069255 | 6/2008 |
| WO | WO-2008/149873 | 12/2008 |
| WO | WO-2009/041713 | 4/2009 |
| WO | WO-2010/071034 | 6/2010 |

OTHER PUBLICATIONS

Meiboom.S et al., "Theory of the Blue Phase of Cholesteric Liquid Crystals", Phys. Rev Lett. (Physical Review Letters), May 4, 1981, vol. 46, No. 18, pp. 1216-1219.

Costello.M et al., "Electron Microscopy of a Cholesteric Liquid Crystal and Its Blue Phase" Phys. Rev. A. (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn]at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18. No. 3, pp. 339-342.

Lee.H et al., "Current Status of, Challenges to, and Perspective View of AM-OLED ", IDW '06: Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp, 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Miyasaka.M, "SUFTLA Flexible Microelectronics on Their Way to Business", SID Digest '07: SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-in. AMOLED Display With Driver Circuit Using Amorphous In—Ga—Zn-Oxide TFTs", IDW '09: Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-plane", SID Digest '09: SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M at al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest'08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T at al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y at al., "Amorphous Oxide TFT Backplanes for Large Size AMOLED Displays", IDW '08; Proceedings of the 6th International Display Workshops, Dec. 3, 2008, pp. 581-584.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M at al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No, 9, pp. 1755-1757.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

\* cited by examiner

FIG. 5A
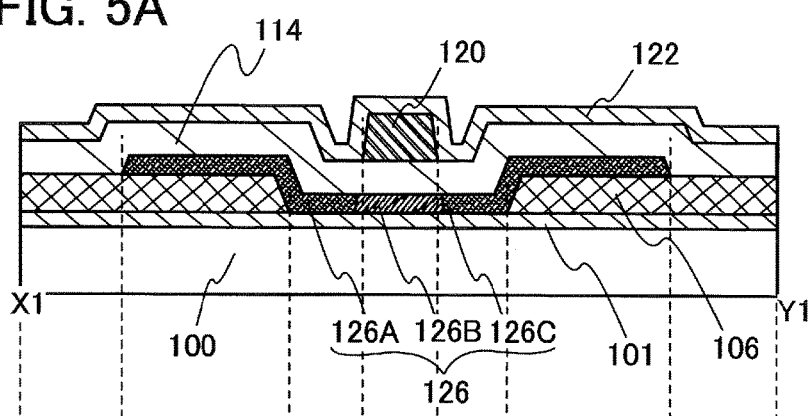
FIG. 5B
FIG. 5C
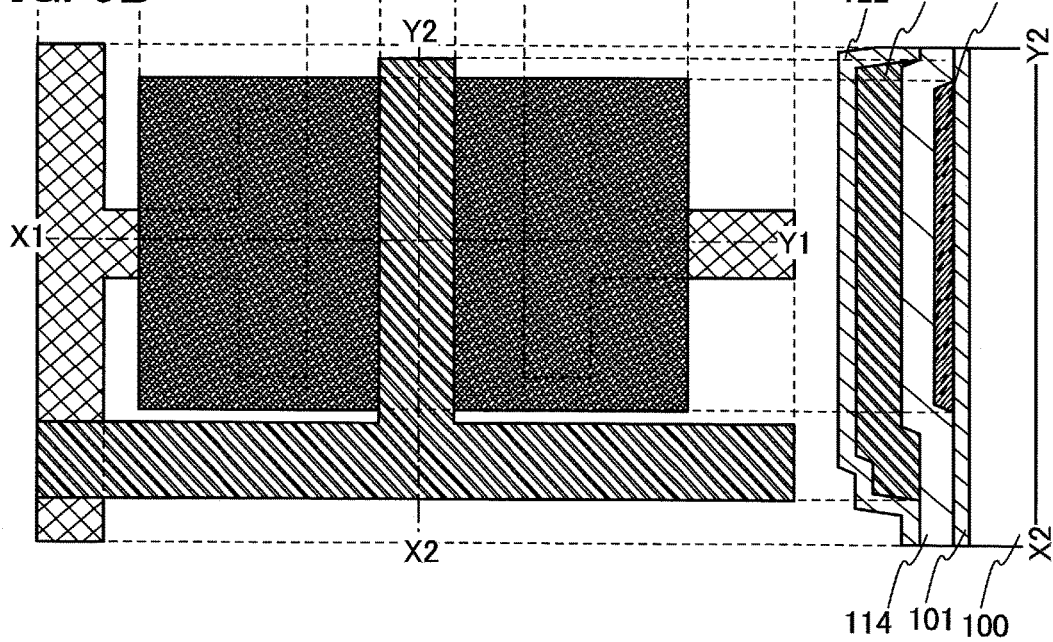

FIG. 12A1
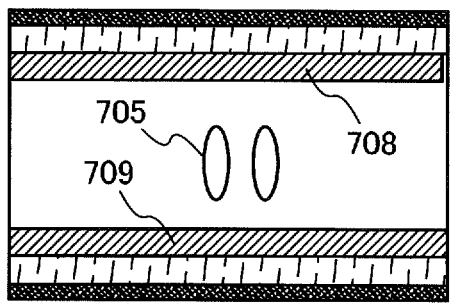
FIG. 12A2
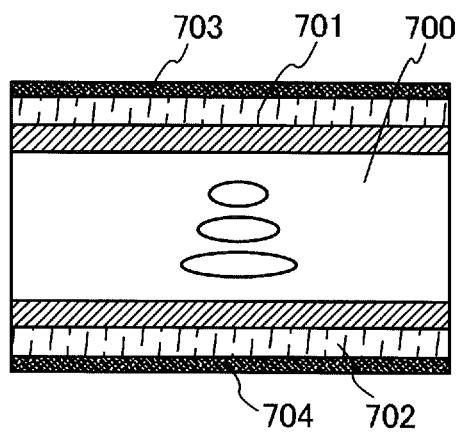
FIG. 12B1
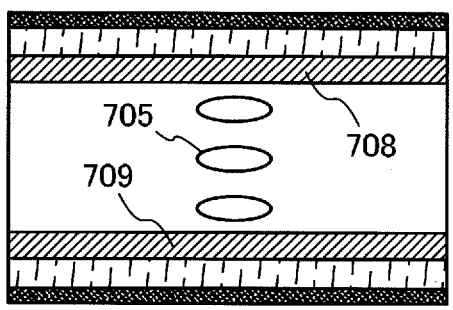
FIG. 12B2
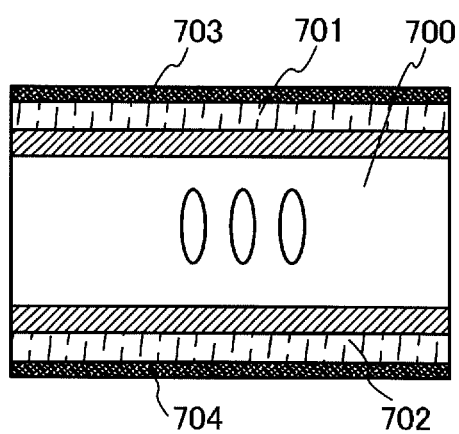
FIG. 12C1
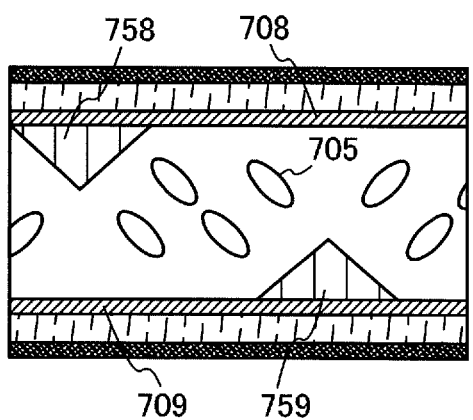
FIG. 12C2
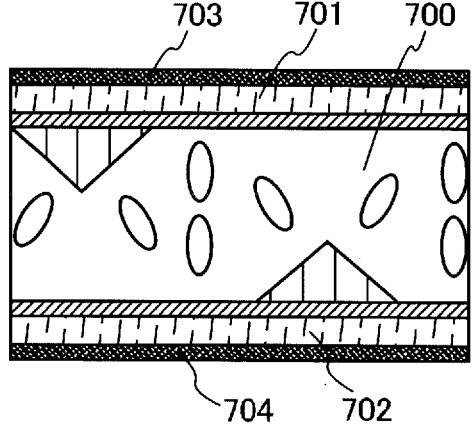

FIG. 13A1
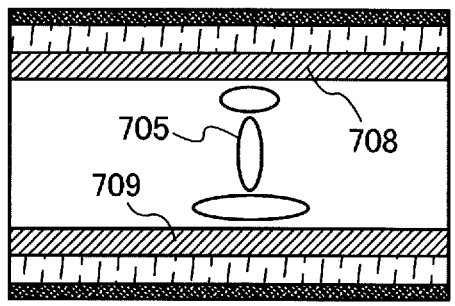
FIG. 13A2
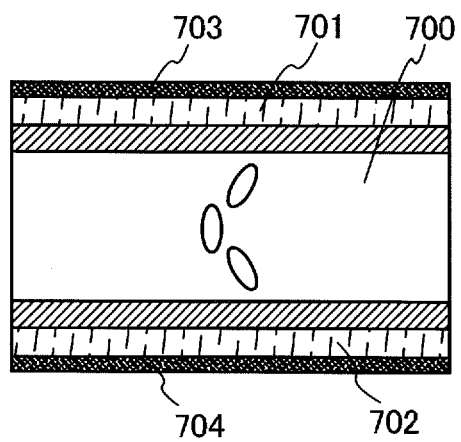
FIG. 13B1
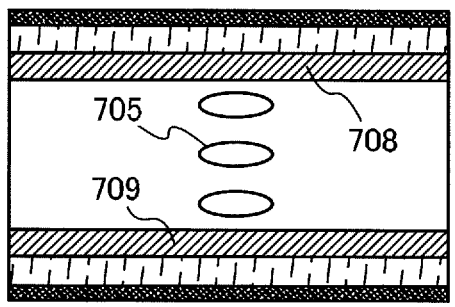
FIG. 13B2
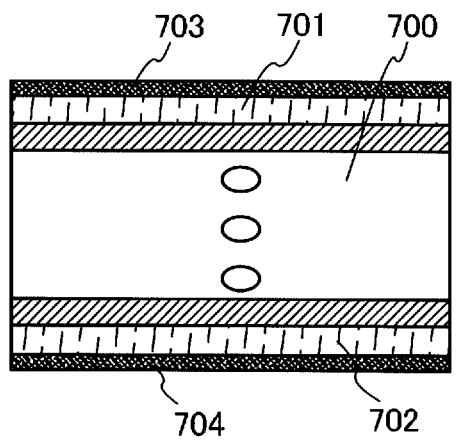

FIG. 14A1
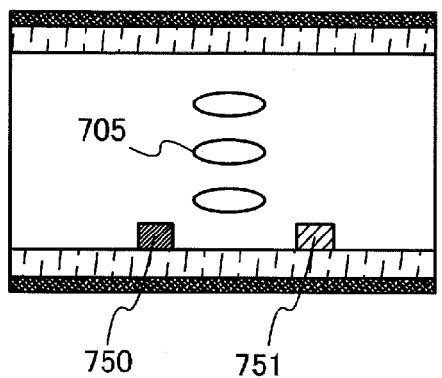
FIG. 14A2
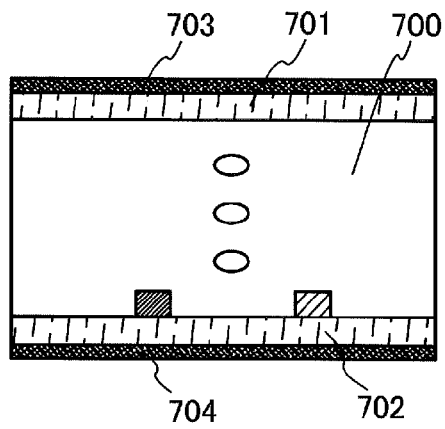
FIG. 14B1
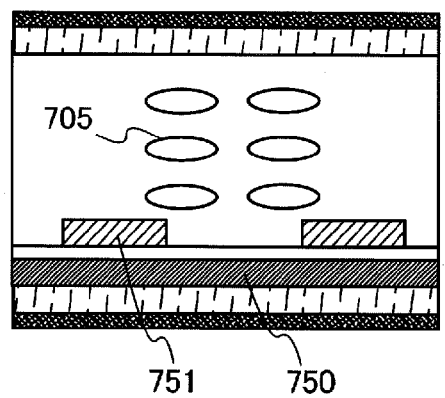
FIG. 14B2
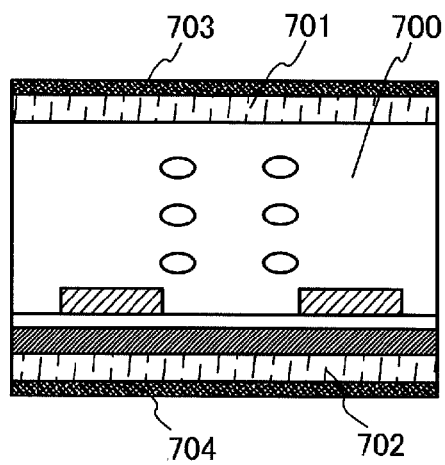

FIG. 21A (100)
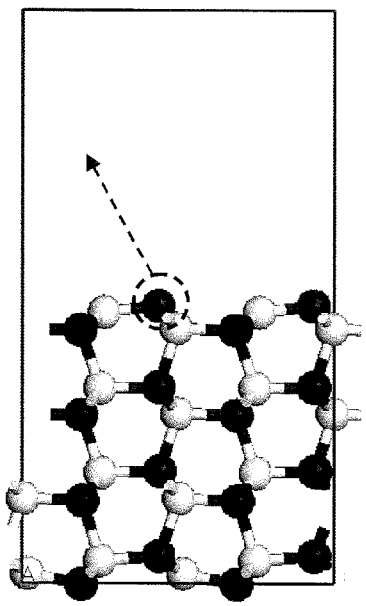
FIG. 21B (110)
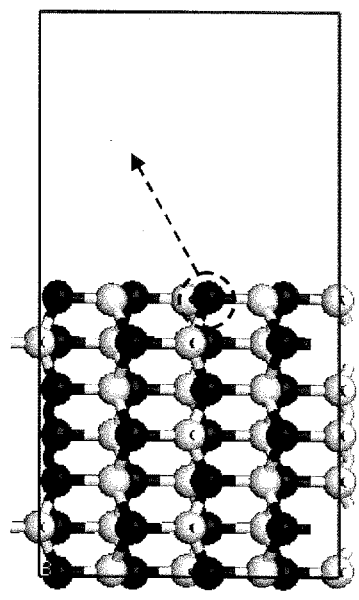
FIG. 21C (001)
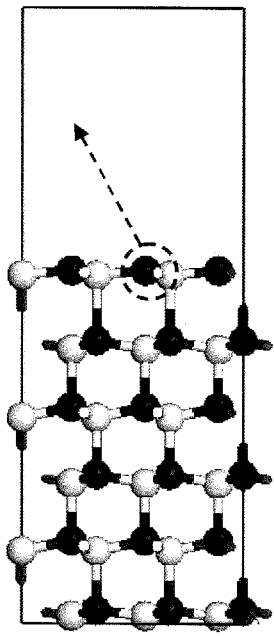

MANUFACTURING METHOD OF THE SEMICONDUCTOR DEVICE

BACKGROUND OF THE INVENTION

1. Field of the Invention

The present invention relates to a semiconductor device and a manufacturing method thereof. Note that in this specification, a semiconductor device refers to a semiconductor element itself or a device including a semiconductor element. As an example of such a semiconductor element, a transistor (a thin film transistor and the like) can be given. In addition, a semiconductor device also refers to a display device such as a liquid crystal display device.

2. Description of the Related Art

Semiconductor devices have been indispensable to our life. Silicon has been mainly used as conventional semiconductor materials applied to semiconductor devices. However, in recent years, as semiconductors applied to semiconductor devices, oxide semiconductors have attracted attention. Semiconductor devices in which a Zn—O-based metal oxide or an In—Ga—Zn—O-based metal oxide is used as oxide semiconductors are disclosed in Patent Document 1 and Patent Document 2.

REFERENCE

[Patent Document 1] Japanese Published Patent Application No. 2007-123861

[Patent Document 2] Japanese Published Patent Application No. 2007-096055

When side surfaces of an oxide semiconductor layer are processed into a desired shape in order to manufacture a semiconductor device to which an oxide semiconductor is applied, the side surfaces of the oxide semiconductor layer are exposed to a vacuum (a reduced-pressure atmosphere or a reducing atmosphere) in a reaction chamber while they are in an active state. Therefore, oxygen is extracted from the side surfaces of the oxide semiconductor layer to the reaction chamber and defects (oxygen deficiency) are caused. Such defects (oxygen deficiency) reduce the resistance of a region in which the defects (oxygen deficiency) exist as donors, which causes leakage current between a source and a drain.

The reason for this is as follows. For example, when the side surfaces of the oxide semiconductor film (oxide semiconductor layer) etched by dry etching are exposed to plasma containing chlorine radicals, fluorine radicals, or the like in etching the oxide semiconductor film, metal atoms exposed on the side surfaces of the etched oxide semiconductor film (oxide semiconductor layer) and the chlorine radicals, the fluorine radicals, or the like are bonded. At this time, the metal atoms and the chlorine atoms, the fluorine atoms, or the like are bonded and desorbed; therefore, oxygen atoms bonded to the metal atoms in the oxide semiconductor layer are activated. Such activated oxygen atoms easily react and are desorbed. Thus, defects (oxygen deficiency) are easily caused on the side surfaces of the oxide semiconductor layer.

SUMMARY OF THE INVENTION

An object of one embodiment of the present invention is to provide a method for manufacturing a semiconductor device by which the semiconductor device can be manufactured while oxygen sufficiently exists on side surfaces of an oxide semiconductor layer.

Another object of one embodiment of the present invention is to provide a semiconductor device in which the amount of defects (oxygen deficiency) in an oxide semiconductor layer are sufficiently small and leakage current between a source and a drain is suppressed.

One embodiment of the present invention is a method for manufacturing a semiconductor device including the following steps: after first heat treatment is performed on an oxide semiconductor film, the oxide semiconductor film is processed to form an oxide semiconductor layer; immediately after that, side walls of the oxide semiconductor layer are covered with an insulating oxide; and in second heat treatment, the side surfaces of the oxide semiconductor layer are prevented from being exposed to a vacuum and defects (oxygen deficiency) in the oxide semiconductor layer can be reduced.

Note that in one embodiment of the present invention, the semiconductor device has a top-gate bottom-contact (TGBC) structure.

Note that in this specification, a "film" refers to a film which is formed over the entire surface of an object by a CVD method (including a plasma CVD method and the like), a sputtering method, or the like. On the other hand, a "layer" refers to a layer which is formed by processing a "film" or a layer which is formed over the entire surface of an object and does not require to be subjected to processing. However, a "film" and a "layer" are used without particular distinction in some cases.

According to one embodiment of the present invention, a semiconductor device can be manufactured while oxygen sufficiently exists on side surfaces of an oxide semiconductor layer.

According to one embodiment of the present invention, defects (oxygen deficiency) in an oxide semiconductor layer of a semiconductor device can be sufficiently reduced and leakage current between a source and a drain can be made low.

BRIEF DESCRIPTION OF THE DRAWINGS

FIGS. 5A to 5C illustrate a semiconductor device of one embodiment of the present invention.

FIGS. 12A1, 12A2, 12B1, 12B2, 12C1, and 12C2 illustrate a semiconductor device of one embodiment of the present invention.

FIGS. 13A1, 13A2, 13B1, and 13B2 illustrate a semiconductor device of one embodiment of the present invention.

FIGS. 14A1, 14A2, 14B1, and 14B2 illustrate a semiconductor device of one embodiment of the present invention.

FIGS. 21A to 21C show calculation results.

DETAILED DESCRIPTION OF THE INVENTION

Figure 1A:
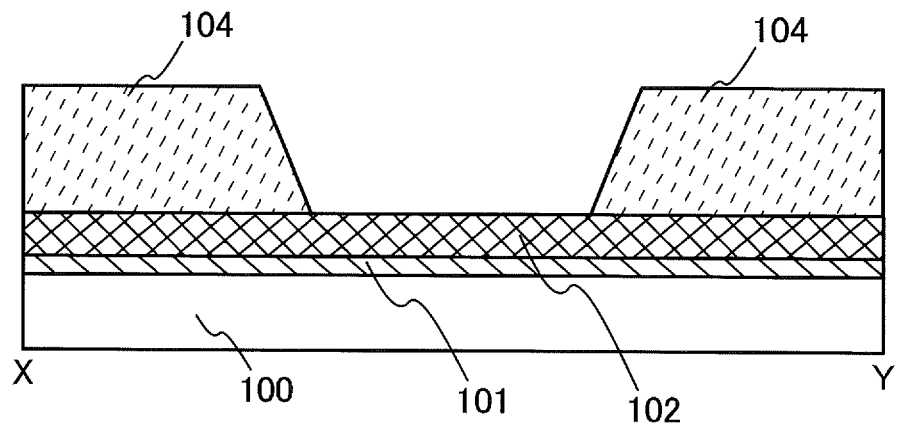
FIGS. 1A to 1C illustrate a method for manufacturing a semiconductor device of one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. Note that an insulating film and an insulating layer are not illustrated in a top view in some cases.

Embodiment 1

In this embodiment, a method for manufacturing a semiconductor device which is one embodiment of the present invention is described. Specifically, a method for manufacturing a transistor is described.

A method for manufacturing a transistor of this embodiment is as follows: a base insulating layer 101 and a first conductive film 102 are formed over a substrate 100; a first etching mask 104 is formed over the first conductive film 102; a first conductive layer 106 is formed by processing the first conductive film 102 using the first etching mask 104; the first etching mask 104 is removed; a first oxide semiconductor film 108 is formed over the first conductive layer 106; the first oxide semiconductor film 108 is processed into a second oxide semiconductor film 109 by performing at least first heat treatment on the substrate 100; a second etching mask 110 is formed over the second oxide semiconductor film 109; a first oxide semiconductor layer 112 is formed by processing the second oxide semiconductor film 109 using the second etching mask 110; the second etching mask 110 is removed; a first insulating layer 114 is formed so as to cover at least the first oxide semiconductor layer 112; a second conductive film 116 is formed over the first insulating layer 114; a third etching mask 118 is formed over the second conductive film 116; a second conductive layer 120 is formed by processing the second conductive film 116 using the third etching mask 118; the third etching mask 118 is removed; a second oxide semiconductor layer 124 including a source region and a drain region is formed by performing ion implantation on the first oxide semiconductor layer 112 using the second conductive layer 120 as a mask; a second insulating layer 122 is preferably formed so as to cover the first insulating layer 114 and the second conductive layer 120; and at least second heat treatment is performed on the substrate 100.

Note that two heat treatment steps are performed before the first heat treatment and one heat treatment step is performed between the first heat treatment and the second heat treatment in a preferable embodiment described below. Therefore, in the following preferable embodiment, the first heat treatment is denoted by "third heat treatment" and the second heat treatment is denoted by "fifth heat treatment".

First, the base insulating layer 101 and the first conductive film 102 are formed over the substrate 100, and the first etching mask 104 is formed over the first conductive film 102 (FIG. 1A).

As the substrate 100, a glass substrate (preferably a non-alkali glass substrate), a quartz substrate, a ceramic substrate, a plastic substrate, or the like can be used as appropriate. Alternatively, a flexible glass substrate or a flexible plastic substrate can be used as the substrate 100. For a plastic substrate, a material having low refractive index anisotropy is preferably used. For example, polyether sulfone (PES), polyimide, polyethylene naphthalate (PEN), polyvinyl fluoride (PVF), polyester, polycarbonate (PC), an acrylic resin, a prepreg which includes a fibrous body in a partially-cured organic resin, or the like can be used.

The base insulating layer 101 contains oxygen at least in its surface and is formed using an insulating oxide in which part of the oxygen is desorbed by heat treatment. As an insulating oxide in which part of oxygen is desorbed by heat treatment, a material containing more oxygen than that in the stoichiometric proportion is preferably used. This is because oxygen can be diffused into an oxide semiconductor film (or layer) in contact with the base insulating layer 101 by heat treatment.

As an example of the case where an insulating oxide contains more oxygen than that in the stoichiometric proportion, the case where x>2 in silicon oxide, SiOx, can be given. However, one embodiment of the present invention is not limited thereto, and the base insulating layer 101 may be formed using silicon oxide, silicon oxynitride, silicon nitride oxide, aluminum oxide, aluminum oxynitride, gallium oxide, hafnium oxide, yttrium oxide, or the like.

Note that "silicon nitride oxide" contains more nitrogen than oxygen.

Note that "silicon oxynitride" contains more oxygen than nitrogen.

Note that the base insulating layer 101 may be formed to have a stacked structure including a plurality of layers. The base insulating layer 101 may have a stacked structure in which a silicon oxide layer is formed over a silicon nitride layer, for example.

In an insulating oxide which contains more oxygen than that in the stoichiometric proportion, part of the oxygen is easily desorbed by heat treatment. The amount of desorbed oxygen (the value converted into that of oxygen atoms) obtained by TDS analysis when part of oxygen is easily desorbed by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, a measurement method using the TDS analysis is described. The desorption amount of gas in the TDS analysis is proportional to an integral value of a TDS spectrum. Thus, from the ratio of the integral value of the TDS spectrum of the insulating oxide to a reference value of a standard sample, the desorption amount of gas can be calculated. The reference value of a standard sample refers to the ratio of the density of a predetermined atom contained in a sample (standard sample) to the integral value of a spectrum.

For example, from a TDS spectrum of a silicon wafer containing hydrogen at a predetermined density which is a standard sample and a TDS spectrum of an insulating oxide, the desorption amount ($N_{O2}$) of oxygen molecules ($O_2$) of the insulating oxide can be obtained by Equation 1.

[Equation 1]

$$N_{O2}=N_{H2}/S_{H2}\times S_{O2}\times \alpha \tag{1}$$

$N_{H2}$ is a value obtained by conversion of the number of hydrogen molecules ($H_2$) desorbed from the standard sample into density. $S_{H2}$ is an integral value of a TDS spectrum of hydrogen molecules ($H_2$) of the standard sample. In other words, the reference value of the standard sample is $N_{H2}/S_{H2}$. $S_{O2}$ is an integral value of a TDS spectrum of oxygen molecules ($O_2$) of the insulating oxide. $\alpha$ is a coefficient affecting the intensity of the TDS spectrum. Refer to Japanese Published Patent Application No. H6-275697 for details of Equation 1.

Note that the desorption amount of the oxygen obtained by TDS analysis (the value converted into that of oxygen atoms) is measured with use of a silicon wafer containing hydrogen atoms at $1\times10^{16}$ atoms/cm$^3$ as the standard sample, by using a thermal desorption spectrometer, EMD-WA1000S/W manufactured by ESCO, Ltd.

Note that in the TDS analysis, oxygen is partly detected as an oxygen atom. The ratio between oxygen molecules and oxygen atoms can be calculated from the ionization rate of the oxygen molecules. Note that, since the coefficient $\alpha$ includes the ionization rate of the oxygen molecules, the number of the released oxygen atoms can also be calculated through the evaluation of the number of the released oxygen molecules.

In addition, $N_{O2}$ is the number of desorbed oxygen molecules ($O_2$). Therefore, the amount of desorbed oxygen converted into oxygen atoms is twice the number of desorbed oxygen molecules ($O_2$).

The base insulating layer 101 may be formed by a sputtering method, a CVD method, or the like. In the case of using a CVD method, it is preferable that hydrogen or the like contained in the base insulating layer 101 be desorbed and removed by heat treatment after the base insulating layer 101 is formed. Note that in the case where the base insulating layer 101 is formed using an insulating oxide in which part of oxygen is desorbed by heat treatment, a sputtering method is preferable, in which case the base insulating layer 101 can be easily formed. In the case where a silicon oxide film is formed as the base insulating layer 101, a quartz (preferably synthesized quartz) target may be used as a target and an argon gas may be used as a sputtering gas. Alternatively, a silicon target may be used as a target and a gas containing oxygen may be used as a sputtering gas. As a gas containing oxygen, a mixed gas of an argon gas and an oxygen gas may be used or only an oxygen gas may be used.

In the case where the base insulating layer 101 is formed using an insulating oxide which contains oxygen part of which is desorbed by heat treatment, the thickness of the base insulating layer 101 is preferably greater than or equal to 50 nm, preferably greater than or equal to 200 nm and less than or equal to 500 nm In particular, when the thickness is increased within the above range, much oxygen can be diffused into the oxide semiconductor film (or layer) in contact with the base insulating layer 101 by heat treatment and defects (oxygen deficiency) at the interface between the base insulating layer 101 and the oxide semiconductor film (or layer) can be reduced, which is preferable.

The first conductive film 102 may be formed to have a single layer or a stacked layer including a conductive material. Here, as a conductive material, a metal such as aluminum, chromium, copper, tantalum, titanium, molybdenum, tungsten, manganese, magnesium, beryllium, or zirconium or an alloy containing one or more of the above metals as a component can be given. For example, a single-layer film of an aluminum film containing silicon, a two-layer stacked film in which a titanium film is provided over an aluminum film, a two-layer stacked film in which a titanium film is provided over a titanium nitride film, a two-layer stacked film in which a tungsten film is provided over a titanium nitride film, a two-layer stacked film in which a tungsten film is provided over a tantalum nitride film, a three-layer stacked film in which an aluminum film is interposed between titanium films, or the like can be given.

Note that the first conductive film 102 is preferably formed using copper because the resistance of a wiring formed by processing the first conductive film 102 can be reduced. Here, in the case where the first conductive film 102 has a stacked structure, at least one layer of the first conductive film 102 is formed using copper.

Alternatively, the first conductive film 102 may be formed using a light-transmitting conductive material such as indium tin oxide, indium oxide containing tungsten oxide, indium zinc oxide containing tungsten oxide, indium oxide containing titanium oxide, indium tin oxide containing titanium oxide, or indium tin oxide to which indium zinc oxide or silicon oxide is added.

Alternatively, the first conductive film 102 may be formed by stacking a film of the light-transmitting conductive material and a film of the metal.

Note that there is no particular limitation on the formation method and the thickness of the first conductive film 102, and they can be determined in consideration of the size or the like of a transistor to be manufactured. As an example of a method of forming the first conductive film 102, a sputtering method, a CVD method, or the like can be given. The thickness of the first conductive film 102 may be, for example, greater than or equal to 100 nm and less than or equal to 300 nm.

The first etching mask 104 may be formed of a resist material. Note that the first etching mask 104 is not limited thereto as long as it functions as a mask when the first conductive film 102 is processed.

Figure 1B:
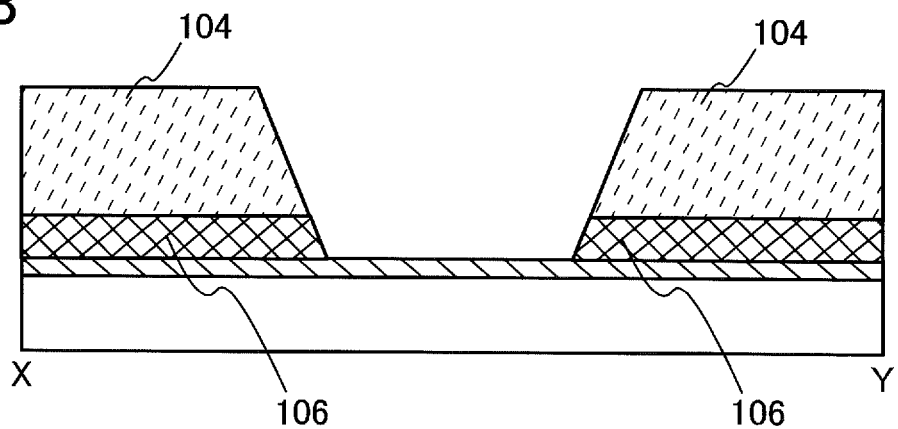

Next, the first conductive film 102 is processed with the use of the first etching mask 104, so that the first conductive layer 106 is formed (FIG. 1B).

Note that the processing may be performed by dry etching. For example, a chlorine gas or a mixed gas of a boron trichloride gas and a chlorine gas may be used as an etching gas used for the dry etching. However, there is no limitation thereto; wet etching may be used or another method capable of processing the first conductive film 102 may be used.

The first conductive layer 106 forms at least a source electrode and a drain electrode.

Figure 1C:
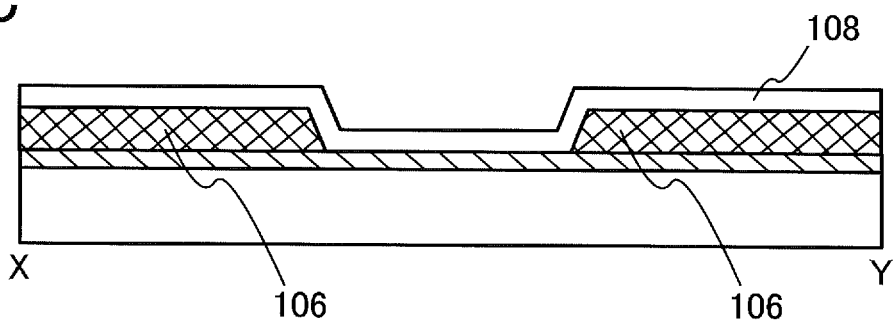

Next, the first etching mask 104 is removed, and the first oxide semiconductor film 108 is formed over the first conductive layer 106 (FIG. 1C).

Note that in the case where the first etching mask 104 is formed using a resist material, the first etching mask 104 may be removed only by ashing.

The first oxide semiconductor film 108 may be formed using a metal oxide, for example, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Ga—O-based metal oxide. Alternatively, an In—O-based metal oxide, a Sn—O-based metal oxide, a Zn—O-based metal oxide, or the like may be used. Note that an n-component metal oxide includes n kinds of metal oxides. Here, for example, an In—Ga—Zn—O-based metal oxide means an oxide containing indium (In), gallium (Ga), and zinc (Zn), and there is no particular limitation on the composition ratio thereof. Further, the In—Ga—Zn—O-based oxide semiconductor may contain an element other than In, Ga, and Zn.

Note that it is preferable that oxygen (O) be excessively contained in the metal oxide as compared to oxygen in the stoichiometric proportion. When oxygen (O) is excessively contained, generation of carriers due to defects (oxygen deficiency) in the first oxide semiconductor film 108 to be formed can be prevented.

Note that for example, in the case where the first oxide semiconductor film 108 is formed using an In—Zn—O-based metal oxide, a target has a composition ratio where In/Zn is 0.5 to 50, preferably 1 to 20, more preferably 1.5 to 15 in an atomic ratio. When the atomic ratio of Zn is in the above preferred range, the field-effect mobility of a transistor can be improved. Here, when the atomic ratio of the compound is In:Zn:O=X:Y:Z, it is preferable to satisfy the relation of Z>1.5X+Y so that oxygen (O) is excessively contained.

Note that the energy gap of a metal oxide which can be applied to the first oxide semiconductor film 108 is preferably 2 eV or more, more preferably 2.5 eV or more, still more preferably 3 eV or more. In this manner, the off-state current of a transistor can be reduced by using a metal oxide having a wide band gap.

Note that the first oxide semiconductor film 108 contains hydrogen. Note that the hydrogen may be contained in the first oxide semiconductor film 108 in the form of a hydrogen molecule, water, a hydroxyl group, or hydride in some cases, in addition to a hydrogen atom. It is preferable that hydrogen contained in the first oxide semiconductor film 108 be as little as possible.

Note that the concentrations of an alkali metal and an alkaline earth metal in the first oxide semiconductor film 108 are preferably low, and these concentrations are preferably $1\times10^{18}$ atoms/cm$^3$ or lower, more preferably $2\times10^{16}$ atoms/cm$^3$ or lower. When an alkali metal and/or an alkaline earth metal are bonded to an oxide semiconductor, carriers may be caused, which causes increase in off-state current of the transistor.

For example, sodium which is one kind of the alkali metal is often diffused into an insulating oxide to be Na$^+$ in the case where the insulating oxide is in contact with an oxide semiconductor layer. In addition, sodium cuts bonds of metal and oxygen which form an oxide semiconductor in the oxide semiconductor film and further enters these bonds in some cases. As a result, the threshold voltage of the transistor shifts to the negative side and the field-effect mobility is decreased. Not only the characteristics of the transistor are deteriorated but also the characteristics of plural transistors on a substrate plane become nonuniform.

Such deterioration and nonuniformity of the characteristics of the transistor due to sodium are particularly remarkable when the hydrogen concentration in the oxide semiconductor film is sufficiently low. Therefore, the hydrogen concentration in the oxide semiconductor layer included in the (completed) transistor is lower than or equal to $1\times10^{18}$ atoms/cm$^3$; when the hydrogen concentration is lower than or equal to $1\times10^{17}$ atoms/cm$^3$, in particular, the concentrations of an alkali metal and an alkaline earth metal are preferably lowered. The measurement value of the Na concentration obtained by using SIMS is preferably lower than or equal to $5\times10^{16}$ atoms/cm$^3$, more preferably lower than or equal to $1\times10^{16}$ atoms/cm$^3$, still more preferably lower than or equal to $1\times10^{15}$ atoms/cm$^3$. In a similar manner, the measurement value of the Li concentration obtained by using SIMS is preferably lower than or equal to $5\times10^{15}$ atoms/cm$^3$, more preferably lower than or equal to $1\times10^{15}$ atoms/cm$^3$. In a similar manner, a measurement value of the K concentration obtained by using SIMS is preferably lower than or equal to $5\times10^{15}$ atoms/cm$^3$, more preferably lower than or equal to $1\times10^{15}$ atoms/cm$^3$.

Note that there is no particular limitation on the formation method and the thickness of the first oxide semiconductor film 108, and they can be determined in consideration of the size or the like of a transistor to be manufactured. As an example of a method for forming the first oxide semiconductor film 108, a sputtering method, a coating method, a printing method, a pulsed laser deposition method, or the like can be given. The thickness of the first oxide semiconductor film 108 is preferably greater than or equal to 3 nm and less than or equal to 50 nm.

Here, as a preferable example, the first oxide semiconductor film 108 is formed by a sputtering method using an In—Ga—Zn—O-based metal oxide target. A rare gas (for example, argon), an oxygen gas, or a mixed gas of a rare gas and an oxygen gas may be used as a sputtering gas.

It is preferable that a high-purity gas in which impurities such as hydrogen, water, a hydroxyl group, or hydride are removed be used as the sputtering gas for the formation of the first oxide semiconductor film 108. When the first oxide semiconductor film 108 is formed while the substrate 100 is kept at high temperature, the concentration of impurities contained in the first oxide semiconductor film 108 can be reduced. Here, the temperature of the substrate 100 is preferably higher than or equal to 100° C. and lower than or equal to 600° C., more preferably higher than or equal to 200° C. and lower than or equal to 400° C.

Note that the first oxide semiconductor film 108 may have an amorphous structure or a crystalline structure. In the case where the first oxide semiconductor film 108 has a crystalline structure, a c-axis aligned crystalline (CAAC) oxide semiconductor film is preferably used. When the first oxide semiconductor film 108 is a CAAC oxide semiconductor film, the reliability of the transistor can be increased.

Note that a CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

In a broad sense, a CAAC oxide semiconductor film means a non-single-crystal oxide material including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC oxide semiconductor film is not a single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not clear in some cases.

Nitrogen may be substituted for part or whole of oxygen included in the CAAC oxide semiconductor film. The c-axes of individual crystalline portions included in the CAAC oxide semiconductor film may be aligned in one direction (e.g., a direction perpendicular to a surface of a substrate over which the CAAC oxide semiconductor film is formed, the film surface of the CAAC oxide semiconductor film, or the interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, the film surface of the CAAC oxide semiconductor film, or the interface of the CAAC oxide semiconductor film).

Note that the CAAC oxide semiconductor film may be a conductor, a semiconductor, or an insulator depending on its composition or the like. Further, The CAAC oxide semiconductor film may transmit or not transmit visible light depending on its composition or the like.

Here, a method for forming the CAAC oxide semiconductor film is described.

First, an oxide semiconductor film is formed by a sputtering method, a molecular beam epitaxy method, an atomic layer deposition method, a pulsed laser deposition method, or the like. Note that by forming an oxide semiconductor film while keeping the substrate 100 at high temperature, the ratio of a crystalline portion to an amorphous portion can be high. At this time, the temperature of the substrate 100 may be, for example, higher than or equal to 150° C. and lower than or equal to 450° C., preferably higher than or equal to 200° C. and lower than or equal to 350° C.

Next, heat treatment (this heat treatment is denoted by first heat treatment) may be performed on the oxide semiconductor film. By the first heat treatment, the ratio of a crystalline portion to an amorphous portion can be high. The temperature of the substrate 100 at the first heat treatment is, for example, higher than or equal to 200° C. and lower than the strain point of the substrate 100, preferably higher than or equal to 250° C. and lower than or equal to 450° C. The time for the first heat treatment may be three minutes or longer. When the time for the first heat treatment is increased, the ratio of a crystalline portion to an amorphous portion can be high; however, the productivity is decreased. Therefore, the time for the first heat treatment is preferably shorter than or equal to 24 hours. Note that the first heat treatment may be performed in an oxidation atmosphere or an inert atmosphere; however, there is no limitation thereto. The first heat treatment may be performed under a reduced pressure.

In this embodiment, an oxidation atmosphere is an atmosphere containing an oxidizing gas. As an example of the oxidizing gas, oxygen, ozone, and nitrous oxide can be given. It is preferable that components (water, hydrogen, and the like) which are not preferably contained in the oxide semiconductor film be removed from the oxidation atmosphere as much as possible. For example, the purity of oxygen, ozone, or nitrous oxide is greater than or equal to 8N (99.999999%), preferably greater than or equal to 9N (99.9999999%).

The oxidation atmosphere may contain an inert gas such as a rare gas. Note that the oxidation atmosphere contains an oxidizing gas at a concentration of greater than or equal to 10 ppm.

In this embodiment, an inert atmosphere contains an inert gas (nitrogen, a rare gas, or the like) and contains a reactive gas such as an oxidizing gas at a concentration of less than 10 ppm.

Note that a rapid thermal anneal (RTA) apparatus may be used for the first heat treatment. With the use of the RTA apparatus, only in a short time, heat treatment can be performed at a temperature of higher than or equal to the strain point of the substrate 100. Thus, the oxide semiconductor film in which the ratio of a crystalline portion to an amorphous portion is high can be formed in a short time and decrease in productivity can be suppressed, which is preferable.

However, the apparatus used for the first heat treatment is not limited to an RTA apparatus; for example, an apparatus provided with a unit that heats an object to be processed by thermal conduction or thermal radiation from a resistance heater or the like may be used. For example, an electric furnace or a rapid thermal anneal (RTA) apparatus such as a gas rapid thermal anneal (GRTA) apparatus or a lamp rapid thermal anneal (LRTA) apparatus can be given as the heat treatment apparatus used for the first heat treatment. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heat medium. Here, the temperature of the high-temperature gas is preferably higher than the heat temperature of the object to be processed.

Note that the above heat treatment apparatus can be used also in other heat treatment in this embodiment.

Here, as a material of the oxide semiconductor film, the above metal oxide may be used.

With use of an In—Ga—Zn—O-based metal oxide in which the nitrogen concentration is higher than or equal to $1 \times 10^{17}$ atoms/cm$^3$ and lower than or equal to $5 \times 10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

Here, a second oxide semiconductor film may be further formed after the first heat treatment. The second oxide semiconductor film can be formed by a method similar to that for forming the oxide semiconductor film as a first layer.

The second oxide semiconductor film may be formed while the substrate 100 is kept at high temperature (a temperature which is substantially the same as that in the first heat treatment). When the second oxide semiconductor film is formed while the substrate 100 is kept at high temperature (the temperature which is substantially the same as that in the first heat treatment), crystal growth using the first-layer oxide semiconductor film as a seed crystal can be caused, so that the second oxide semiconductor film can be formed. At this time, in the case where the first-layer oxide semiconductor film and the second oxide semiconductor film are formed using the same element, the crystal growth is homo-growth, and in the case where either the first-layer oxide semiconductor film or the second oxide semiconductor film contains a different element, the crystal growth is hetero-growth.

Note that second heat treatment may be further performed after the second oxide semiconductor film is formed. The second heat treatment may be performed in a manner similar to that of the first heat treatment which is performed after the first-layer oxide semiconductor film is formed. By the second heat treatment, crystals can grow in a left amorphous portion and the ratio of a crystalline portion to an amorphous portion can be high. The crystal growth may be homo-growth or hetero-growth.

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated to a metal atom may vary according to the kind of an adjacent metal. In contrast, in the case of the CAAC oxide semiconductor film, the number of oxygen atoms coordinated to a metal atom is substantially the same. Therefore, defects (oxygen deficiency) are hardly observed even at a microscopic level, and charge transfer and instability of electric conductivity due to hydrogen atoms (including hydrogen ions), alkali metal atoms, or the like can be prevented.

Therefore, a transistor is formed using a CAAC oxide semiconductor, whereby the amount of change in the threshold voltage of the transistor between before and after light irradiation or a bias-temperature stress (BT) test performed on the transistor can be suppressed, and the transistor can have stable electrical characteristics.

Next, third heat treatment is performed on the substrate 100, so that the second oxide semiconductor film 109 is formed.

Note that by the third heat treatment performed here, hydrogen contained in the first oxide semiconductor film 108 is desorbed and oxygen is supplied to the first oxide semiconductor film 108 from the base insulating layer 101 which is an insulating oxide film. The temperature of the third heat treatment is higher than or equal to 150° C. and lower than the strain point of the substrate 100 (a temperature at which the quality of the substrate 100 is changed in the case where the substrate 100 is a substrate other than a glass substrate), preferably higher than or equal to 250° C. and lower than or equal to 450° C., more preferably higher than or equal to 300° C. and lower than or equal to 450° C. Further, in the case where the first oxide semiconductor film 108 is a CAAC oxide semiconductor film, the temperature of the substrate 100 is preferably higher than the temperature at which the first oxide semiconductor film 108 is formed.

Note that, here, oxygen supplied to the first oxide semiconductor film 108 is diffused into at least the vicinity of the interface or the interface between the base insulating layer 101 which is the insulating oxide film and the first oxide semiconductor film 108.

Note that the third heat treatment is preferably performed in an inert gas atmosphere.

Note that by the third heat treatment, hydrogen contained in the first oxide semiconductor film 108 is desorbed and oxygen can be supplied to the first oxide semiconductor film 108 (into the film and/or into the vicinity of the interface) from the base insulating layer 101 which is the insulating oxide film. Therefore, defects (oxygen deficiency) in the first oxide semiconductor film 108 (into the film and/or into the vicinity of the interface) can be reduced.

Since the third heat treatment is performed before the first oxide semiconductor film 108 is processed as described above, defects (oxygen deficiency) contained in the oxide semiconductor layer can be reduced without exposure of side surfaces of the oxide semiconductor layer in which defects (oxygen deficiency) are easily caused by oxygen desorption.

The reason for this is as follows. For example, when the side surfaces of the oxide semiconductor film (oxide semiconductor layer) etched by dry etching are exposed to plasma containing chlorine radicals, fluorine radicals, or the like, metal atoms exposed on the side surfaces of the etched oxide semiconductor film (oxide semiconductor layer) and the chlorine radicals, the fluorine radicals, or the like are bonded. At this time, the metal atoms and the chlorine atoms, the fluorine atoms, or the like are bonded and desorbed; therefore, oxygen atoms bonded to the metal atoms in the oxide semiconductor layer are activated. Such activated oxygen atoms easily react and are desorbed. Thus, defects (oxygen deficiency) are easily caused on the side surfaces of the oxide semiconductor layer.

Figure 20:
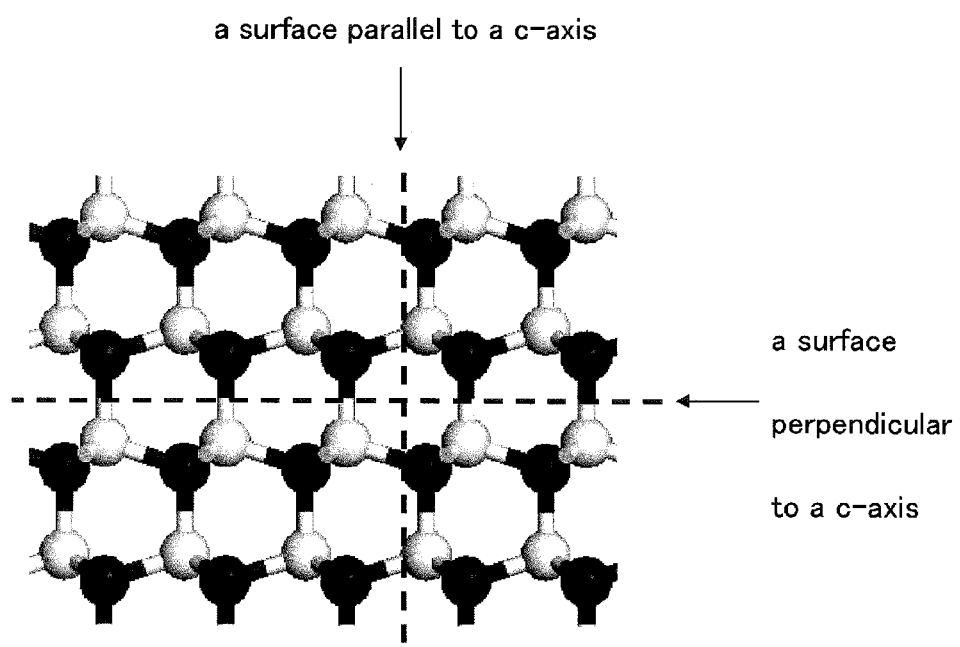
FIG. 20 shows calculation results.

Here, verification results on how easily oxygen deficiency is caused at a top surface and a side surface of an oxide semiconductor film, obtained through calculation using the following model, will be described. Note that a CAAC oxide semiconductor is complicated to calculate due to having a plurality of crystal planes on one side surface. Therefore, calculation was conducted here using a ZnO single crystal that has a wurtzite structure having c-axis alignment. As crystal models, the (001) plane, the (100) plane, and the (110) plane obtained by cutting the crystal along planes parallel to the c-axis and a plane perpendicular to the c-axis as shown in FIG. 20 were used.

After making the surface structures, calculation of the cases in which oxygen is released from the (100) plane, the (110) plane, and the (001) plane as shown in FIGS. 21A to 21C was conducted, and the easiness of release was compared between the surface structures.

A model was made by cutting the crystal to have the (001) plane on the surface. Since the calculation was conducted using a three-dimensional periodic structure, the model was a slab model having two (001) planes and having a vacuum region whose thickness is 1 nm. Similarly, a slab model having the (100) plane on the surface and a slab model having the (110) plane on the surface were made as examples of the side surface because the side surface is assumed to be perpendicular to the (001) plane. By calculating these two planes, a tendency to release oxygen from planes perpendicular to the (001) plane can be analyzed. In this case also, the thickness of the vacuum region is 1 nm. The number of atoms in the (100) plane model, the (110) plane model, and the (001) plane model were set to be 64, 108, and 108, respectively. Further, structures which were obtained by removing oxygen from the respective surfaces of the above three structures were made.

For the calculation, CASTEP, which is a program using the density functional theory, was used. A plane wave basis pseudopotential method was used as a method for the density functional theory, and GGA-PBE was used for a functional. First, in a four-atom unit cell of a wurtzite structure, the structure including a lattice constant was optimized. Next, based on the optimized structure, the surface structure was made. Then, the surface structure with oxygen vacancies and the surface structure without oxygen vacancies were subjected to structure optimization with a lattice constant fixed. Energy after the structure optimization was used.

The cut-off energy was assumed to be 380 eV in unit cell calculation and 300 eV in surface structure calculation. The k-points were 9×9×6 in the unit cell calculation, 3×2×1 in the (100) plane model calculation, 1×2×2 in the (110) plane model calculation, and 2×2×1 in the (001) plane model calculation.

The following calculation was performed on the above surface structures to obtain an energy difference (here, referred to as a bound energy): the energy of the structure with oxygen vacancies and half the energy of an oxygen molecule are added, and the energy of the structure without oxygen vacancies is subtracted therefrom. Oxygen is more likely to be released on the surface having a lower bound energy.

(Bound energy)=(Energy of the structure with oxygen vacancies)+(Half the energy of an oxygen molecule)−(Energy of the structure without oxygen vacancies)  [Equation 2]

Bound energies of the respective surfaces obtained according to Equation 2 are shown in Table 1.

TABLE 1

|  | Bound energy |
| --- | --- |
| (100) plane model | 2.89 |
| (110) plane model | 2.64 |
| (001) plane model | 3.38 |

From the result in Table 1, it can be said that bound energies of the (100) plane and the (110) plane are lower than that of the (001) plane and oxygen is more likely to be released from the (100) plane and the (110) plane than from the (001) plane. In other words, it can be found that oxygen is more likely to be released from the side surface than the top surface of the ZnO film having c-axis alignment in a direction perpendicular to the top surface. Although ZnO which is an example of CAAC oxide semiconductors has mixed various crystal planes, it has the same kind of planes as a ZnO single crystal on its side surface. Therefore, it can be said that a tendency to release oxygen of the ZnO is similar to that of the ZnO single crystal.

Since the first oxide semiconductor film 108 after being subjected to the third heat treatment as described above and the first oxide semiconductor film 108 before being subjected to the third heat treatment are significantly different from each other, the film on which the third heat treatment is performed is denoted by the second oxide semiconductor film 109.

Figure 2A:
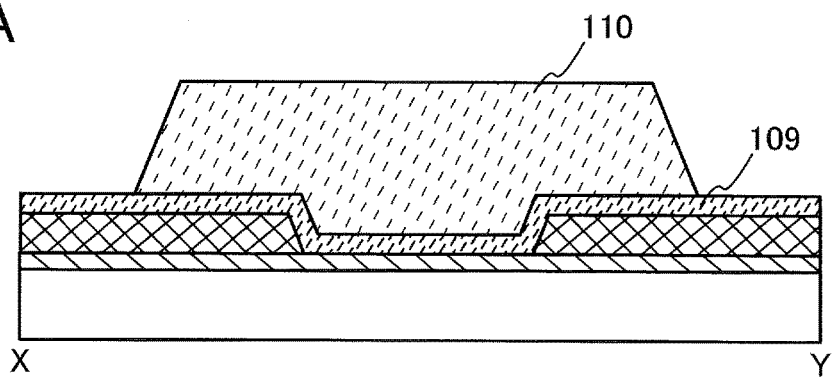
FIGS. 2A to 2C illustrate a method for manufacturing a semiconductor device of one embodiment of the present invention.

Next, the second etching mask 110 is formed over the second oxide semiconductor film 109 (FIG. 2A).

The second etching mask 110 may be formed using a resist material. Note that the second etching mask 110 is not limited thereto as long as it functions as a mask when the second oxide semiconductor film 109 is processed.

Figure 2B:
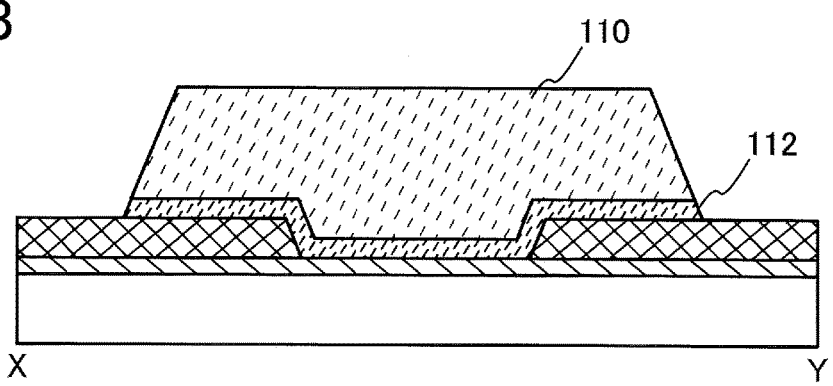

Next, the second oxide semiconductor film 109 is processed with the use of the second etching mask 110, so that the first oxide semiconductor layer 112 is formed (FIG. 2B).

Note that the processing may be performed by dry etching. For example, a chlorine gas or a mixed gas of a boron trichloride gas and a chlorine gas may be used as an etching gas used for the dry etching. However, there is no limitation thereto; wet etching may be used or another method capable of processing the second oxide semiconductor film 109 may be used.

Figure 2C:
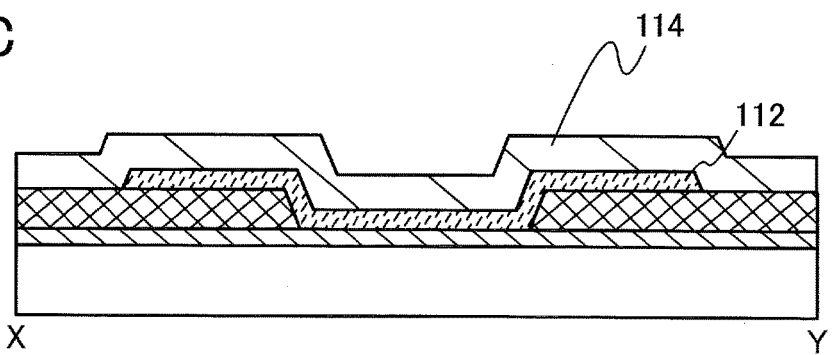

Next, the second etching mask 110 is removed, and the first insulating layer 114 is formed so as to cover at least the first oxide semiconductor layer 112 (FIG. 2C).

Note that in the case where the second etching mask 110 is formed using a resist material, the second etching mask 110 may be removed only by ashing.

The first insulating layer 114 contains oxygen at least in a portion in contact with the first oxide semiconductor layer 112 and is preferably formed using an insulating oxide in which part of the oxygen is desorbed by heating. In other words, the materials given as the material of the base insulating layer 101 are preferably used. When the portion of the first insulating layer 114 which is in contact with the first oxide semiconductor layer 112 is formed using silicon oxide, oxygen can be diffused into the first oxide semiconductor layer 112 and reduction in the resistance of the transistor can be prevented.

Note that the first insulating layer 114 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, whereby gate leakage current can be reduced. Here, gate leakage current refers to leakage current which flows between a gate electrode and a source or drain electrode. Further, a layer formed using the high-k material and a layer formed using any of silicon oxide, silicon oxynitride, silicon nitride, silicon nitride oxide, aluminum oxide, aluminum oxynitride, and gallium oxide may be stacked. Note that even in the case where the first insulating layer 114 has a stacked structure, the portion in contact with the first oxide semiconductor layer 112 is preferably formed using an insulating oxide.

The first insulating layer 114 may be formed by a sputtering method. For example, the thickness of the first insulating layer 114 is preferably greater than or equal to 1 nm and less than or equal to 300 nm, more preferably greater than or equal to 5 nm and less than or equal to 50 nm. When the thickness of the first insulating layer 114 is greater than or equal to 5 nm, gate leakage current can be particularly reduced.

Note that it is preferable that before the first insulating layer 114 is formed, a surface of the first oxide semiconductor layer 112 be exposed to plasma of an oxidizing gas to reduce defects (oxygen deficiency) on the surface of the first oxide semiconductor layer 112.

The first insulating layer 114 forms at least a gate insulating layer.

Here, fourth heat treatment may be performed. By the fourth heat treatment, oxygen may be supplied to the second oxide semiconductor layer 124 from the second insulating layer 122 which is an insulating oxide film. The fourth heat treatment is performed at a temperature of higher than or equal to 150° C. and lower than or equal to 450° C., preferably higher than or equal to 250° C. and lower than or equal to 325° C. In the fourth heat treatment, the temperature may be gradually increased to the aforementioned temperature or may be increased to the aforementioned temperature step-by-step. Note that the fourth heat treatment may be performed in an oxidation atmosphere or an inert atmosphere; however, there is no limitation thereto. The fourth heat treatment may be performed under a reduced pressure.

Figure 3A:
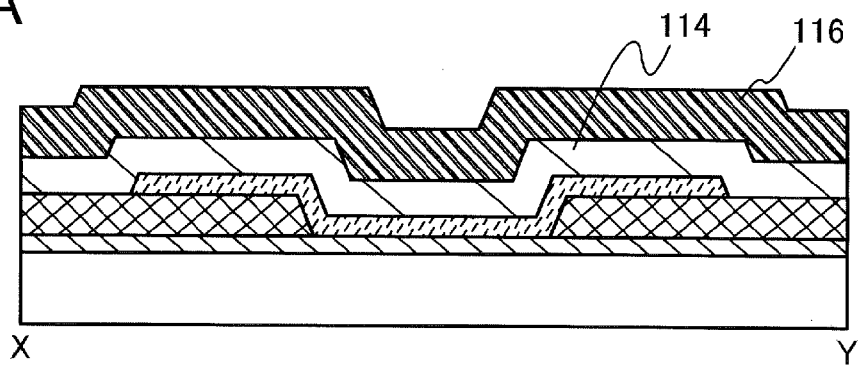
FIGS. 3A to 3C illustrate a method for manufacturing a semiconductor device of one embodiment of the present invention.

Next, the second conductive film 116 is formed over the first insulating layer 114 (FIG. 3A).

The second conductive film 116 may be formed using a material and a method similar to those of the first conductive film 102.

Note that the second conductive film 116 is preferably formed using copper because the resistance of a wiring formed by processing the second conductive film 116 can be reduced. Here, in the case where the second conductive film 116 has a stacked structure, at least one layer of the second conductive film 116 is formed using copper.

Figure 3B:
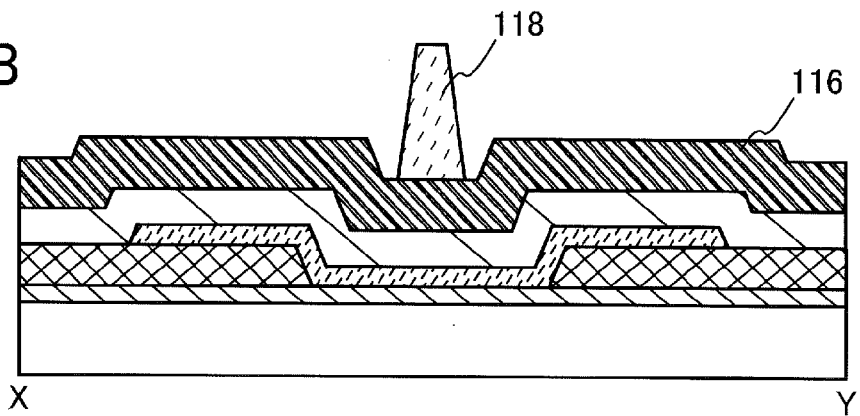

Next, the third etching mask 118 is formed over the second conductive film 116 (FIG. 3B).

The third etching mask 118 may be formed using a resist material. Note that the third etching mask 118 is not limited thereto as long as it functions as a mask when the second conductive film 116 is processed.

Figure 3C:
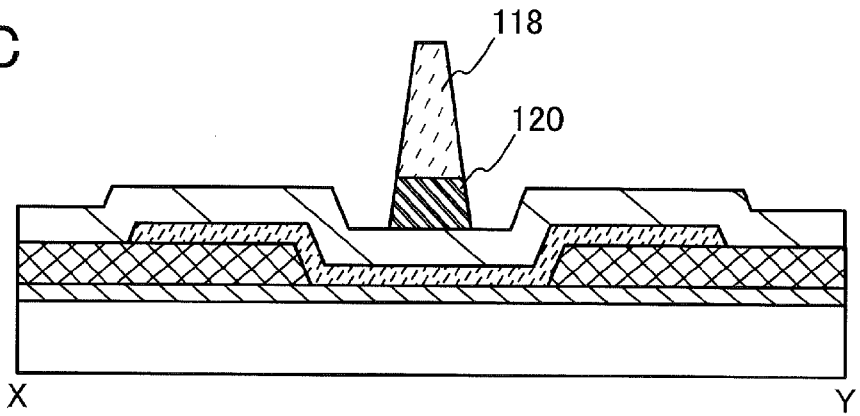

Next, the second conductive film 116 is processed with the use of the third etching mask 118, so that the second conductive layer 120 is formed (FIG. 3C).

Note that the processing may be performed by dry etching. For example, a chlorine gas or a mixed gas of a boron trichloride gas and a chlorine gas may be used as an etching gas used for the dry etching. However, there is no limitation thereto; wet etching may be used or another method capable of processing the second conductive film 116 may be used.

The second conductive layer 120 forms at least a gate electrode.

Note that a buffer layer is preferably provided using an In—Ga—Zn—O-based metal oxide between the first insulating layer 114 and the second conductive layer 120. By providing the buffer layer using an In—Ga—Zn—O-based metal oxide between the first insulating layer 114 and the second conductive layer 120, threshold voltage can shift to the positive side.

Figure 4A:
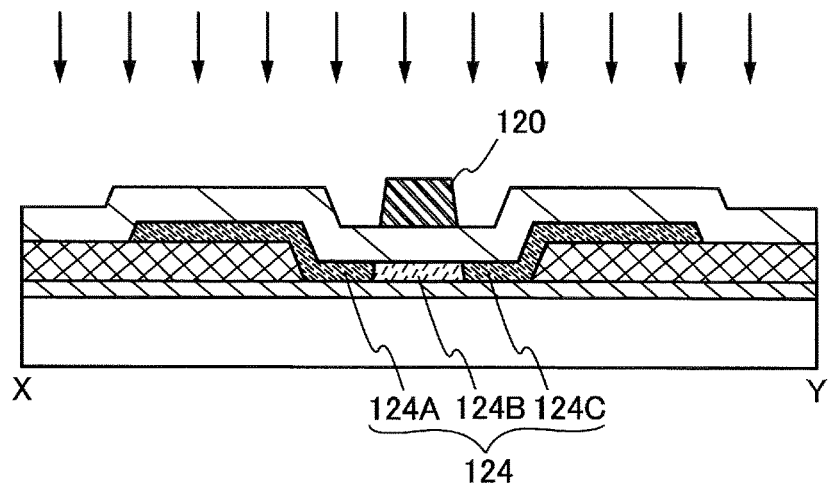
FIGS. 4A to 4C illustrate a method for manufacturing a semiconductor device of one embodiment of the present invention.

Next, the third etching mask 118 is removed and a dopant is added to the first oxide semiconductor layer 112 using the second conductive layer 120 as a mask, so that the second oxide semiconductor layer 124 including the source region and the drain region is formed (FIG. 4A). The second oxide semiconductor layer 124 includes a region 124A which is one of the source region and the drain region, a channel formation region 124B, and a region 124C which is the other of the source region and the drain region.

Note that in the case where the third etching mask 118 is formed using a resist material, the third etching mask 118 may be removed only by ashing.

Note that, here, the dopant may be added by an ion implantation method or an ion doping method. Alternatively, the dopant may be added by performing plasma treatment in an atmosphere of a gas containing the dopant. As the added dopant, hydrogen, a rare gas, nitrogen, phosphorus, arsenic, or the like may be used.

Figure 4B:
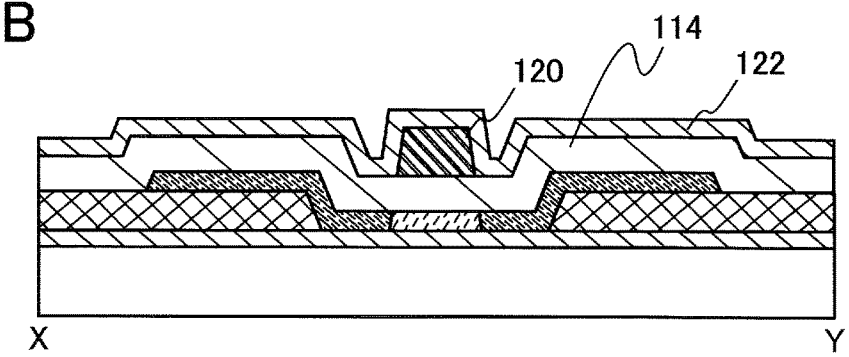

Next, the second insulating layer 122 is formed so as to cover the first insulating layer 114 and the second conductive layer 120 (FIG. 4B).

The second insulating layer 122 may be formed using a material and a method similar to those of the base insulating layer 101 and the first insulating layer 114 and is preferably an insulating oxide film.

The second insulating layer 122 functions at least as a passivation film. Note that the second insulating layer 122 is not necessarily provided.

Next, fifth heat treatment is performed on the substrate 100, so that a third oxide semiconductor layer 126 is formed.

Figure 4C:
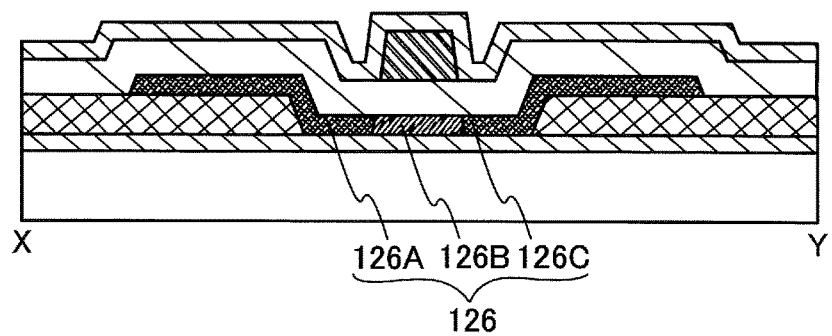

The third oxide semiconductor layer 126 includes a region 126A which is one of the source region and the drain region, a channel formation region 126B, and a region 126C which is the other of the source region and the drain region (FIG. 4C).

Note that by the fifth heat treatment performed here, oxygen may be supplied to the second oxide semiconductor layer 124 from the second insulating layer 122 which is the insulating oxide film. The fifth heat treatment is performed at a temperature of higher than or equal to 150° C. and lower than or equal to 450° C., preferably higher than or equal to 250° C. and lower than or equal to 325° C. In the fifth heat treatment, the temperature may be gradually increased to the aforementioned temperature or may be increased to the aforementioned temperature step-by-step.

Note that the fifth heat treatment is preferably performed in an inert gas atmosphere.

The hydrogen concentration in the third oxide semiconductor layer 126 after the fifth heat treatment is preferably lower than $5 \times 10^{18}$ atoms/cm$^3$, more preferably lower than or equal to $1 \times 10^{18}$ atoms/cm$^3$, further more preferably lower than or equal to $5 \times 10^{17}$ atoms/cm$^3$, still further more preferably lower than or equal to $1 \times 10^{16}$ atoms/cm$^3$.

It is preferable that the nitrogen concentration in the third oxide semiconductor layer 126 after the fifth heat treatment be higher than or equal to $1 \times 10^{19}$ atoms/cm$^3$ and lower than or equal to $1 \times 10^{22}$ atoms/cm$^3$ in the region 126A and the region 126C and lower than $5 \times 10^{18}$ atoms/cm$^3$ in the region 126B.

Through the above steps, the transistor can be manufactured. The method for manufacturing a transistor in this embodiment can prevent the reduction of the resistance of the oxide semiconductor layer (in particular, side walls thereof) and reduce defects (oxygen deficiency) of the oxide semiconductor layer provided in the transistor.

Note that FIGS. 5A to 5C illustrate an example of a completed transistor which is manufactured in this embodiment. FIG. 5A is a cross-sectional view taken along line X1-Y1 in FIG. 5B and FIG. 5C is a cross-sectional view taken along line X2-Y2 in FIG. 5B.

In the transistor illustrated in FIGS. 5A to 5C, a source electrode and a drain electrode are provided using the first conductive layer 106 over the substrate 100, the third oxide semiconductor layer 126 is provided between the source electrode and the drain electrode, a gate insulating layer is provided using the first insulating layer 114 so as to cover the third oxide semiconductor layer 126, a gate electrode is provided using the second conductive layer 120 in a portion overlapping with the region 126B which serves as a channel formation region over the first insulating layer 114, and the second insulating layer 122 is provided over the first insulating layer 114 and the second conductive layer 120. In other words, the transistor illustrated in FIGS. 5A to 5C has a TGBC structure. The transistor illustrated in FIGS. 5A to 5C can have extremely low off-state current.

Embodiment 2

In this embodiment, an application example of the transistor described in Embodiment 1 will be described.

Figure 6A:
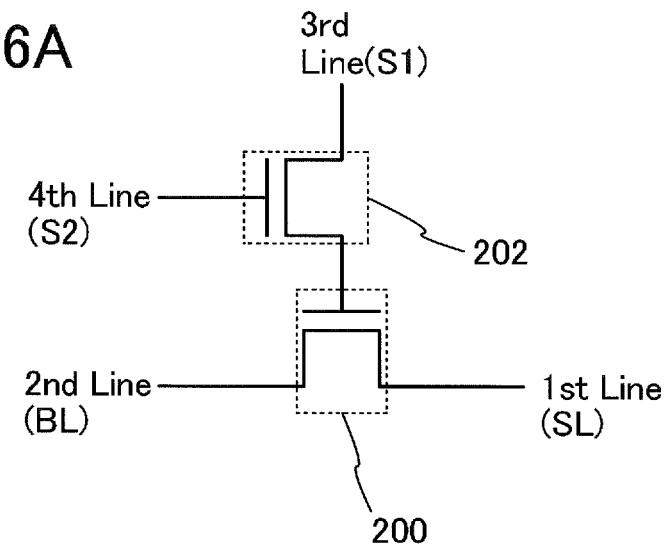
FIGS. 6A and 6B each illustrate a semiconductor device of one embodiment of the present invention.

FIG. 6A illustrates an example of a circuit diagram of a memory element (hereinafter, denoted by a memory cell) included in a semiconductor device. The memory cell illustrated in FIG. 6A includes a transistor 200 in which a channel formation region is formed using a material other than an oxide semiconductor (e.g., silicon, germanium, silicon carbide, gallium arsenide, gallium nitride, an organic compound, or the like) and a transistor 202 in which a channel formation region is formed using an oxide semiconductor.

The transistor 202 in which the channel formation region is formed using an oxide semiconductor is manufactured by the method for manufacturing a semiconductor device of one embodiment of the present invention which is described in Embodiment 1.

As illustrated in FIG. 6A, a gate of the transistor 200 is electrically connected to one of a source and a drain of the transistor 202. A first wiring SL (a 1st line, also referred to as a source line) is electrically connected to a source of the transistor 200. A second wiring BL (a 2nd line, also referred to as a bit line) is electrically connected to a drain of the transistor 200. A third wiring 51 (a 3rd line, also referred to as a first signal line) is electrically connected to the other of the source and the drain of the transistor 202. A fourth wiring S2 (a 4th line, also referred to as a second signal line) is electrically connected to a gate of the transistor 202.

The transistor 200 in which the channel formation region is formed using a material other than an oxide semiconductor, e.g., single crystal silicon can operate at sufficiently high speed. Therefore, with the use of the transistor 200, high-speed reading of stored contents and the like are possible. The transistor 202 in which the channel formation region is formed using an oxide semiconductor has low off-state current. Therefore, when the transistor 202 is turned off, a potential of the gate of the transistor 200 can be held for a very long time.

By utilizing a characteristic in which the potential of the gate of the transistor 200 can be held for a very long time, writing, holding, and reading of data are possible as described below.

Firstly, writing and holding of data are described. First, a potential of the fourth wiring S2 is set to a potential at which the transistor 202 is turned on, so that the transistor 202 is turned on. Thus, a potential of the third wiring S1 is supplied to the gate of the transistor 200 (writing). After that, the potential of the fourth wiring S2 is set to a potential at which the transistor 202 is turned off, so that the transistor 202 is turned off, and thus, the potential of the gate of the transistor 200 is held (holding).

Since the off-state current of the transistor 202 is low, the potential of the gate of the transistor 200 is held for a long time. For example, when the potential of the gate of the transistor 200 is a potential at which the transistor 200 is in an on state, the on state of the transistor 200 is held for a long time. In addition, when the potential of the gate of the transistor 200 is a potential at which the transistor 200 is in an off state, the off state of the transistor 200 is held for a long time.

Then, reading of data is described. When a predetermined potential (constant potential) is supplied to the first wiring SL in a state where the on state or the off state of the transistor 200 is held, a potential of the second wiring BL varies depending on the on state or the off state of the transistor 200. For example, when the transistor 200 is in the on state, the potential of the second wiring BL becomes lower than the potential of the first wiring SL. On the other hand, when the transistor 200 is in the off state, the potential of the second wiring BL does not vary.

In such a manner, the potential of the second wiring BL and a predetermined potential are compared with each other in a state where data is held, whereby the data can be read out.

Then, rewriting of data is described. Rewriting of data is performed in a manner similar to that of the writing and holding of data. That is, a potential of the fourth wiring S2 is set to a potential at which the transistor 202 is turned on, so that the transistor 202 is turned on. Thus, a potential of the third wiring S1 (a potential for new data) is supplied to the gate of the transistor 200. After that, the potential of the fourth wiring S2 is set to be a potential at which the transistor 202 is turned off, so that the transistor 202 is turned off, and thus, the new data is held.

In the memory cell of this embodiment, data can be directly rewritten by another writing of data as described above. For that reason, erasing operation which is necessary for a flash memory or the like is not needed, so that a reduction in operation speed due to erasing operation can be suppressed. In other words, high-speed operation of the semiconductor device including the memory cell can be realized.

Figure 6B:
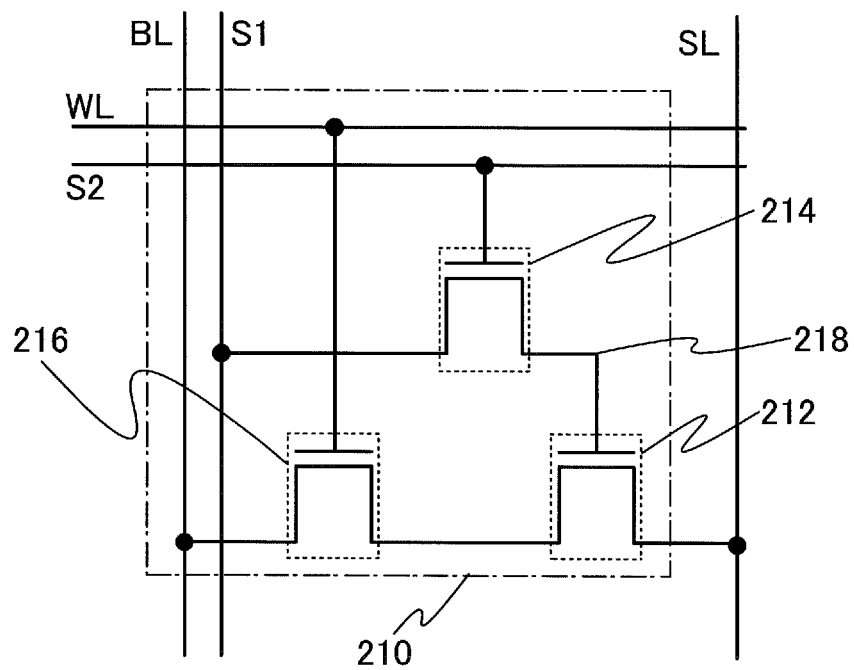

FIG. 6B is a circuit diagram illustrating an example of the memory cell illustrated in FIG. 6A.

A memory cell 210 illustrated in FIG. 6B includes a first wiring SL (a source line), a second wiring BL (a bit line), a third wiring S1 (a first signal line), a fourth wiring S2 (a second signal line), a fifth wiring WL (a word line), a transistor 212 (a first transistor), a transistor 214 (a second transistor), and a transistor 216 (a third transistor). In each of the transistors 212 and 216, a channel formation region is formed using a material other than an oxide semiconductor, and in the transistor 214, a channel formation region is formed using an oxide semiconductor.

Here, a gate of the transistor 212 is electrically connected to one of a source and a drain of the transistor 214. In addition, the first wiring SL is electrically connected to a source of the transistor 212. A drain of the transistor 212 is electrically connected to a source of the transistor 216. The second wiring BL is electrically connected to a drain of the transistor 216. The third wiring S1 is electrically connected to the other of the source and the drain of the transistor 214. The fourth wiring S2 is electrically connected to a gate of the transistor 214. The fifth wiring WL is electrically connected to a gate of the transistor 216.

Next, operation of the circuit is specifically described. Note that the values of potential, voltage, and the like used in the following description may be changed as appropriate.

When data is written into the memory cell 210, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 216 is in an off state and the transistor 214 is in an on state. Note that at the end of the writing, before the potential of the third wiring S1 is changed, the fourth wiring S2 is set to 0 V so that the transistor 214 is turned off.

As a result, a potential of a node (hereinafter, referred to as a node 218) electrically connected to the gate of the transistor 212 is set to approximately 2 V after the writing of the data "1" and set to approximately 0 V after the writing of the data "0". A charge corresponding to a potential of the third wiring S1 is accumulated at the node 218; since the off-state current of the transistor 214 is low, the potential of the gate of the transistor 212 is held for a long time.

When data is read from the memory cell, the first wiring SL is set to 0 V, the fifth wiring WL is set to 2 V, the fourth wiring S2 and the third wiring S1 are set to 0 V, and a reading circuit electrically connected to the second wiring BL is set in an operation state. At this time, the transistor 216 is in an on state and the transistor 214 is in an off state.

The transistor 212 is in an off state when the data "0" has been written (the node 218 is set to approximately 0 V), so that the resistance between the second wiring BL and the first wiring SL is high. On the other hand, the transistor 212 is in an on state when the data "1" has been written (the node 218 is set to approximately 2 V), so that the resistance between the second wiring BL and the first wiring SL is low. A reading circuit can read the data "0" or the data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. The operation voltages are set so that the transistor 212 is turned off in the case of data "0" and turned on in the case of data "1", the transistor 214 is turned on at the time of writing and turned off in periods except the time of writing, and the transistor 216 is turned on at the time of reading.

In this embodiment, the memory cell with a minimum storage unit (one bit) is described for convenience; however, the structure of the memory cell is not limited thereto and a combination of more than one of the above memory cells may be used. For example, it is possible to make a NAND-type or NOR-type memory cell by using a combination of more than one of the above memory cells.

Figure 7:
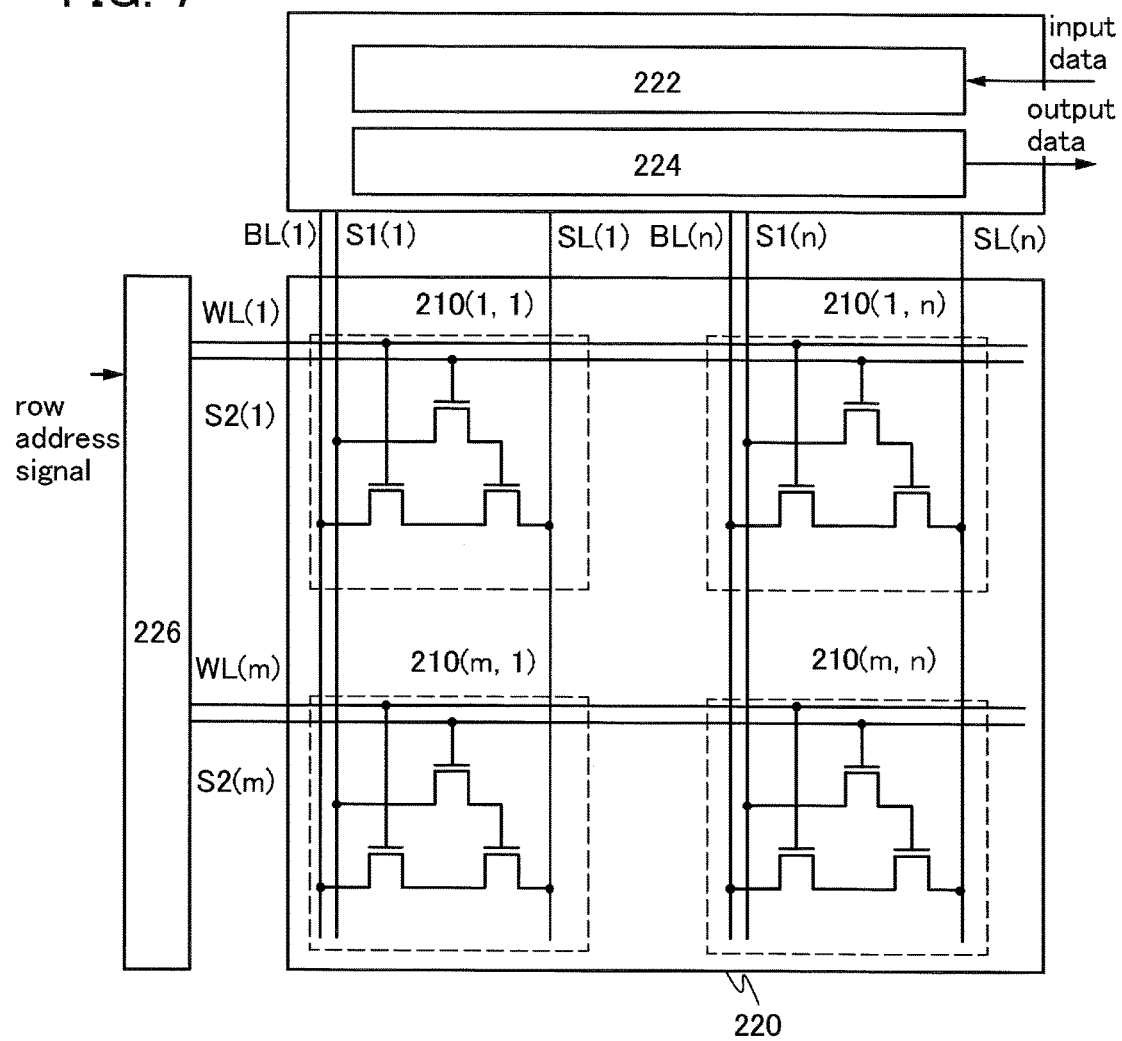
FIG. 7 illustrates a semiconductor device of one embodiment of the present invention.

FIG. 7 is a block circuit diagram of a semiconductor device according to one embodiment of the present invention. The semiconductor device includes m×n bits of memory capacitance.

The semiconductor device illustrated in FIG. 7 includes a memory cell array 220, a driver circuit 222 electrically connected to the second wiring BL and the third wiring S1, a reading circuit 224, and a driver circuit 226 electrically connected to the fourth wiring S2 and the fifth wiring WL. The memory cell array 220 includes m fourth wirings S2, m fifth wirings WL, n second wirings BL, n third wirings S1, and a plurality of memory cells 210(1,1) to 210(m,n) which is arranged in a matrix of m rows by n columns (m and n are each a natural number). A refresh circuit or the like may be provided in addition to the above.

A memory cell 210(i,j) is described as a typical example of the memory cell. Here, the memory cell 210(i,j) (i is an integer of greater than or equal to 1 and less than or equal to m and j is an integer of greater than or equal to 1 and less than or equal to n) is electrically connected to a second wiring BL(j), a third wiring S1(j), a fourth wiring S2(i), a fifth wiring WL(i), and a first wiring SL(j). A potential Vs of the first wiring SL is supplied to the first wiring SL(j). The second wirings BL(1) to BL(n) and the third wirings S1(1) to S1(n) are electrically connected to the driver circuit 222 and the reading circuit 224. The fifth wirings WL(1) to WL(m) and the fourth wirings S2(1) to S2(m) are electrically connected to the driver circuit 226.

The operation of the semiconductor device illustrated in FIG. 7 is described. In this structure, data is written and read per row.

When data is written into memory cells 210(i,1) to 210(i,n) of an i-th row, the potential Vs of the first wiring SL(1) to SL(n) is set to 0 V, a fifth wiring WL(i) and the second wirings BL(1) to BL(n) are set to 0 V, and a fourth wiring S2(i) is set to 2 V. At this time, the transistors 214 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(i) is set to 0 V before the potentials of the third wirings S1(1) to S1(n) are changed, so that the transistors 214 are turned off. Moreover, the fifth wirings WL except the fifth wiring WL(i) and the fourth wirings S2 except the fourth wiring S2(i) are also set to 0 V.

As a result, the potential of the node 218 connected to the gate of the transistor 212 in the memory cell into which data "1" has been written is set to approximately 2 V, and the potential of the node 218 in the memory cell into which data "0" has been written is set to approximately 0 V. The potential of the node 218 of the non-selected memory cell is not changed.

When data is read from the memory cells 210(i,1) to 210(i,n) of the i-th row, the potential Vs of the first wiring SL(1) to SL(n) is set to 0 V, the fifth wiring WL(i) is set to 2 V, the fourth wiring S2(i) and the third wirings S1(1) to S1(n) are set to 0 V, and the reading circuit 224 connected to the second wirings BL(1) to BL(n) is set in an operation state. The reading circuit 224 can read data "0" or data "1" in accordance with the difference in resistance state of the memory cell, for example. Note that the fifth wirings WL except the fifth wiring WL(i) and the fourth wirings S2 except the fourth wirings S2(i) are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that in this embodiment, the value which is used as the value of the potential is calculated when a ground potential is 0 V.

As described in this embodiment, the potential of the node connected to a source or a drain of a transistor to which Embodiment 1 is applied (transistor in which a channel region is formed using an oxide semiconductor) can be held for a very long time; therefore, a memory cell in which writing, holding, and reading of data are possible with low power consumption can be manufactured.

Embodiment 3

In this embodiment, an application example of the transistor described in Embodiment 1, which is different from the example described in Embodiment 2, will be described.

Figure 8A:
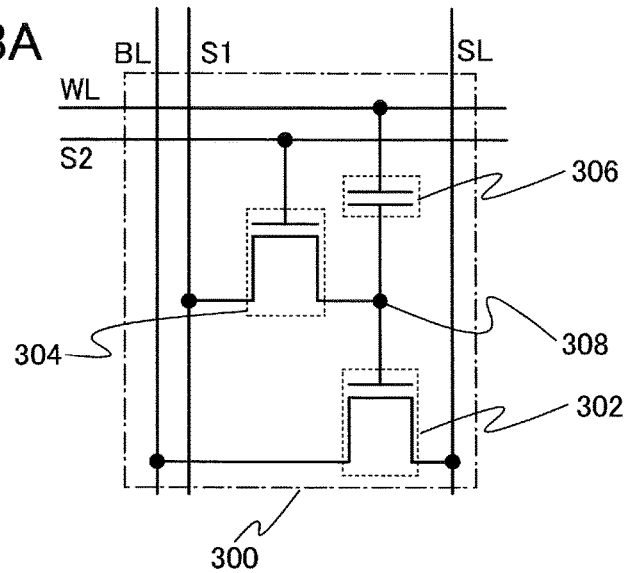
FIGS. 8A and 8B each illustrate a semiconductor device of one embodiment of the present invention.

In this embodiment, a memory cell including a capacitor and a semiconductor memory device will be described. A memory cell 300 illustrated in FIG. 8A includes a first wiring SL, a second wiring BL, a third wiring S1, a fourth wiring S2, a fifth wiring WL, a transistor 302 (a first transistor), a transistor 304 (a second transistor), and a capacitor 306. In the transistor 302, a channel formation region is formed using a material other than an oxide semiconductor, and in the transistor 304, a channel formation region is formed using an oxide semiconductor.

The transistor 304 in which the channel formation region is formed using an oxide semiconductor is manufactured by the method for manufacturing a semiconductor device of one embodiment of the present invention which is described in Embodiment 1.

Here, a gate of the transistor 302, one of a source and a drain of the transistor 304, and one electrode of the capacitor 306 are electrically connected to one another. In addition, the first wiring SL and a source of the transistor 302 are electrically connected to each other. The second wiring BL and a drain of the transistor 302 are electrically connected to each other. The third wiring S1 and the other of the source and the drain of the transistor 304 are electrically connected to each other. The fourth wiring S2 and a gate of the transistor 304 are electrically connected to each other. The fifth wiring WL and the other electrode of the capacitor 306 are electrically connected to each other.

Next, operation of the circuit will be specifically described. Note that the values of potential, voltage, and the like used in the following description may be changed as appropriate.

When data is written into the memory cell 300, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 304 is turned on. Note that, to finish writing, the fourth wiring S2 is supplied with 0 V before the potential of the third wiring S1 is changed, so that the transistor 304 is turned off.

As a result, the potential of a node 308 electrically connected to the gate of the transistor 302 is set to approximately 2 V after the writing of data "1" and is set to approximately 0 V after the writing of data "0".

When data is read from the memory cell 300, the first wiring SL is set to 0 V, the fifth wiring WL is set to 2 V, the fourth wiring S2 is set to 0 V, the third wiring S1 is set to 0 V, and a reading circuit electrically connected to the second wiring BL is set in an operation state. At this time, the transistor 304 is turned off.

The state of the transistor 302 in the case where the fifth wiring WL is set to 2 V will be described. The potential of the node 308 which determines the state of the transistor 302 depends on capacitance C1 between the fifth wiring WL and the node 308, and capacitance C2 between the gate of the transistor 302 and the source and drain of the transistor 302.

Note that the third wiring S1 at the time of reading is set to 0 V; however, the third wiring S1 may be in a floating state or may be charged to have a potential higher than 0 V. Data "1" and data "0" are defined for convenience and may be reversed.

The potential of the third wiring S1 at the time of writing may be selected from the potentials of data "0" and data "1" as long as the transistor 304 is turned off after the writing and the transistor 302 is off in the case where the potential of the fifth wiring WL is set to 0 V. The potential of the fifth wiring WL at the time of reading may be selected so that the transistor 302 is turned off in the case where data "0" has been written and is turned on in the case where data "1" has been written. The threshold voltage of the transistor 302 can be determined as appropriate as long as the transistor 302 operates in the above-described manner.

An example of a NOR semiconductor device (semiconductor memory device) in which a memory cell including a capacitor and a selection transistor having a first gate and a second gate is used will be described.

Figure 8B:
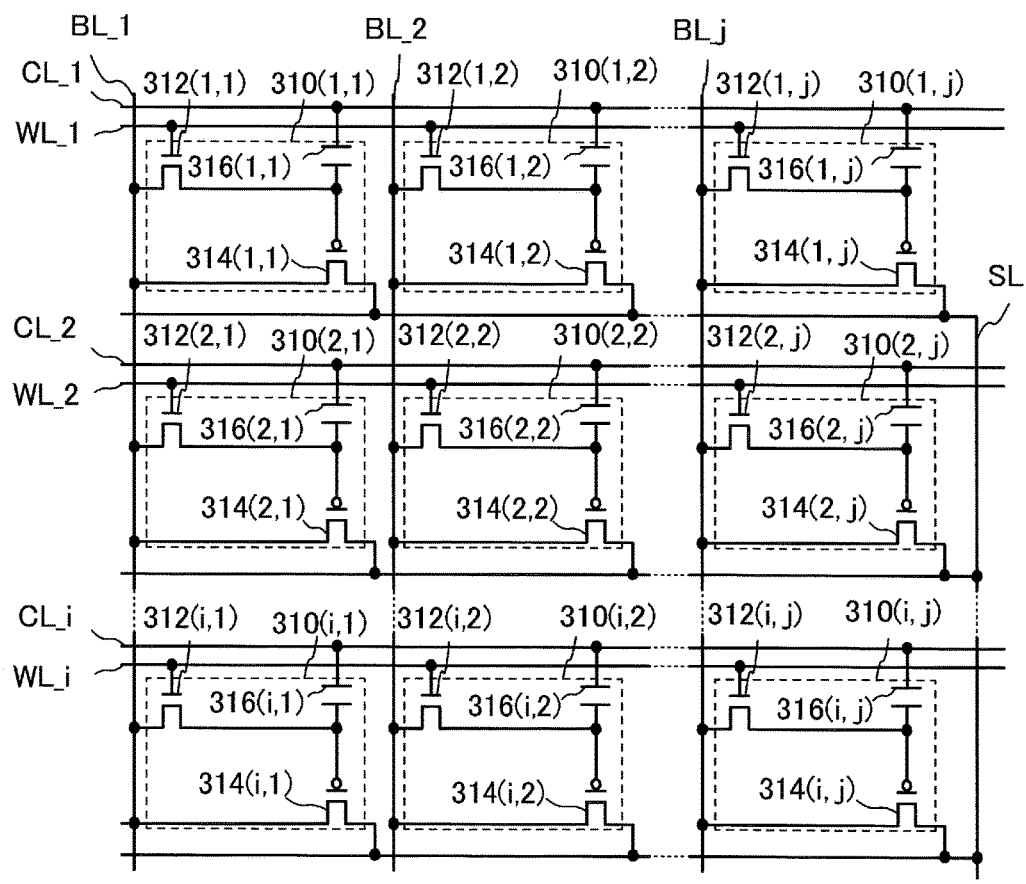

The memory cell array illustrated in FIG. 8B includes a plurality of memory cells 310 arranged in a matrix of i rows (i is a natural number of 3 or more) and j columns (j is a natural number of 3 or more), i word lines WL (word lines WL_1 to WL_i), i capacitor lines CL (capacitor lines CL_1 to CL_i), j bit lines BL (bit lines BL_1 to BL_j), and a source line SL. Here, i and j are each set to a natural number of 3 or more for convenience; however, the numbers of rows and columns of the memory cell array in this embodiment are each not limited to 3 or more. A memory cell array with one row or one column may be used, or a memory cell array with two rows or two columns may be used.

Further, each of the plurality of memory cells 310 (referred to as a memory cell 310(M,N) (note that M is a natural number of greater than or equal to 1 and less than or equal to i and that N is a natural number of greater than or equal to 1 and less than or equal to j)) includes a transistor 312(M,N), a capacitor 316(M,N), and a transistor 314(M,N).

Note that the capacitor includes a first capacitor electrode, a second capacitor electrode, and a dielectric layer provided between the first capacitor electrode and the second capacitor electrode. A charge is accumulated in the capacitor in accordance with potential difference between the first capacitor electrode and the second capacitor electrode.

The transistor 312(M,N) is an n-channel transistor which has a source, a drain, and a gate. Note that in the semiconductor device (semiconductor memory device) in this embodiment, the transistor 312 is not necessarily an n-channel transistor.

One of the source and the drain of the transistor 312(M,N) is electrically connected to the bit line BL_N. The gate of the transistor 312(M,N) is electrically connected to the word line WL_M. With the structure in which the one of the source and the drain of the transistor 312(M,N) is electrically connected to the bit line BL_N, data can be selectively read from memory cells.

The transistor 312(M,N) serves as a selection transistor in the memory cell 310(M,N).

As the transistor 312(M,N), a transistor in which a channel formation region is formed using an oxide semiconductor can be used.

The transistor 314(M,N) is a p-channel transistor. Note that in the semiconductor device (semiconductor memory device) in this embodiment, the transistor 314 is not necessarily a p-channel transistor.

One of a source and a drain of the transistor 314(M,N) is electrically connected to the source line SL. The other of the source and the drain of the transistor 314(M,N) is electrically connected to the bit line BL_N. A gate of the transistor 314(M,N) is electrically connected to the other of the source and the drain of the transistor 312(M,N).

The transistor 314(M,N) serves as an output transistor in the memory cell 310(M,N). As the transistor 314(M,N), for example, a transistor in which a channel formation region is formed using single crystal silicon can be used.

A first capacitor electrode of the capacitor 316(M,N) is electrically connected to the capacitor line CL_M. A second capacitor electrode of the capacitor 316(M,N) is electrically connected to the other of the source and the drain of the transistor 312(M,N). Note that the capacitor 316(M,N) serves as a storage capacitor.

The potential of the word lines WL_1 to WL_i may be controlled by, for example, a driver circuit including a decoder.

The potential of the bit lines BL_1 to BL_j may be controlled by, for example, a driver circuit including a decoder.

The potential of the capacitor lines CL_1 to CL_i may be controlled by, for example, a driver circuit including a decoder.

The gate line driver circuit is formed using a circuit which includes a diode and a capacitor whose first capacitor electrode is electrically connected to an anode of the diode, for example.

Note that in this embodiment, the value which is used as the value of the potential is calculated when a ground potential is 0 V.

As described in this embodiment, the potential of the node connected to a source or a drain of a transistor to which Embodiment 1 is applied (transistor in which a channel region is formed using an oxide semiconductor) can be held for a very long time; therefore, a memory cell in which writing, holding, and reading of data are possible with low power consumption can be manufactured.

Embodiment 4

In this embodiment, an application example of the transistor described in Embodiment 1, which is different from the examples described in Embodiments 2 and 3, will be described.

Figure 9A:
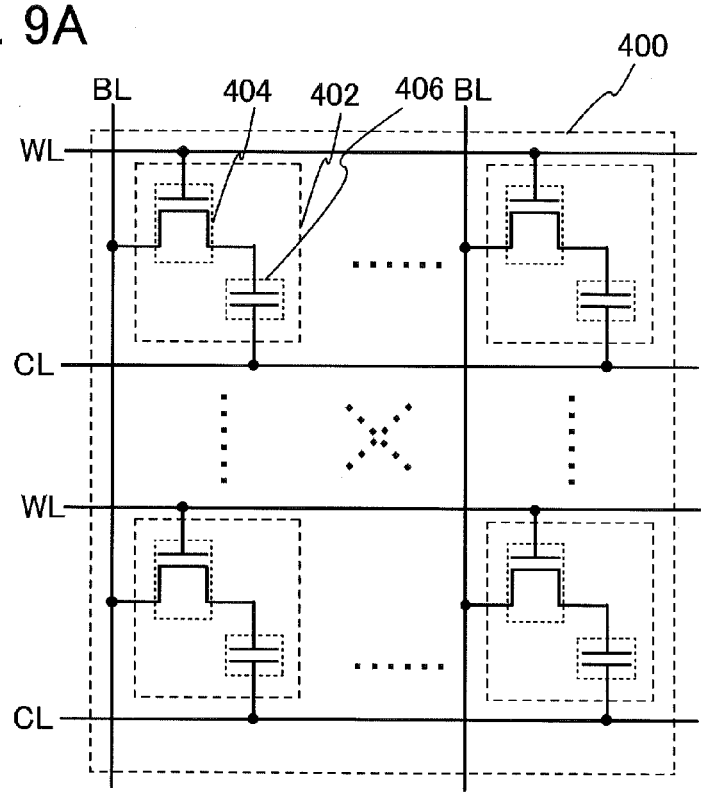
FIGS. 9A and 9B each illustrate a semiconductor device of one embodiment of the present invention.

FIG. 9A illustrates an example of a semiconductor device whose structure corresponds to that of a so-called dynamic random access memory (DRAM). A memory cell array 400 illustrated in FIG. 9A has a structure in which a plurality of memory cells 402 is arranged in a matrix. Further, the memory cell array 400 includes m first wirings BL and n second wirings WL. Note that in this embodiment, the first wiring BL and the second wiring WL are referred to as a bit line BL and a word line WL, respectively.

The memory cell 402 includes a transistor 404 and a capacitor 406. A gate of the transistor 404 is electrically connected to the second wiring WL. Further, one of a source and a drain of the transistor 404 is electrically connected to the first wiring BL. The other of the source and the drain of the transistor 404 is electrically connected to one electrode of the capacitor 406. The other electrode of the capacitor 406 is electrically connected to a capacitor line CL and is supplied with a predetermined potential.

The transistor 404 in which the channel formation region is formed using an oxide semiconductor is manufactured by the method for manufacturing a semiconductor device of one embodiment of the present invention which is described in Embodiment 1.

The transistor manufactured by the method for manufacturing a semiconductor device of one embodiment of the present invention which is described in Embodiment 1 is characterized by having low off-state current. Accordingly, when the transistor is applied to the semiconductor device illustrated in FIG. 9A, which is regarded as a so-called DRAM, a substantially nonvolatile memory can be obtained.

Figure 9B:
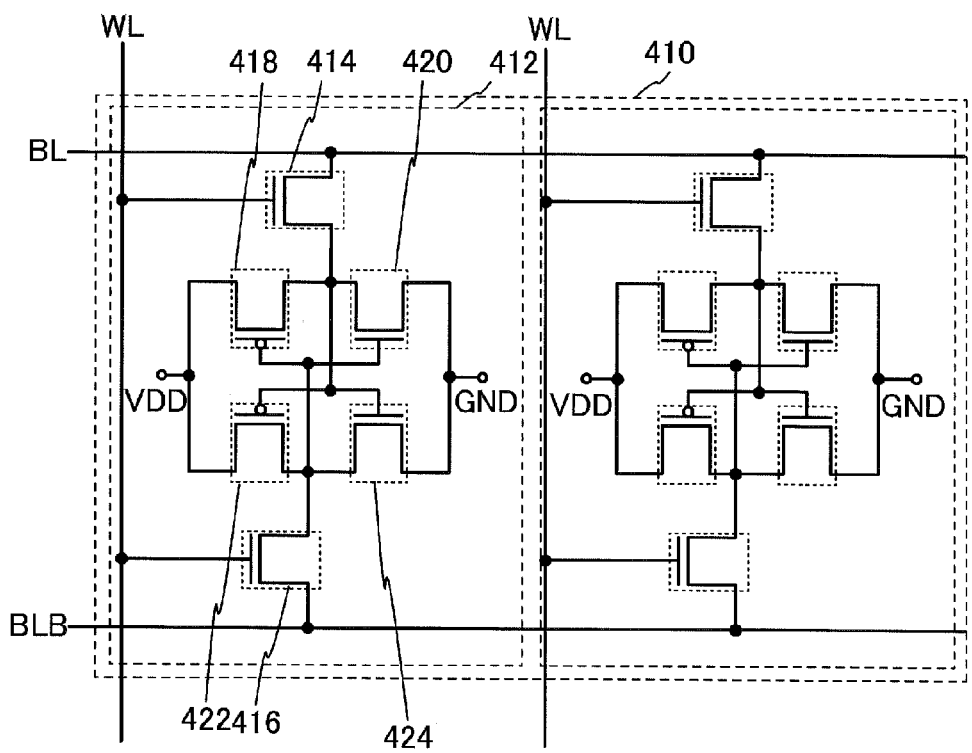

FIG. 9B illustrates an example of a semiconductor device whose structure corresponds to that of a so-called static random access memory (SRAM). A memory cell array 410 illustrated in FIG. 9B can have a structure in which a plurality of memory cells 412 is arranged in a matrix. Further, the memory cell array 410 includes a plurality of first wirings BL, a plurality of second wirings BLB, and a plurality of third wirings WL. In addition, certain positions are connected to a power supply potential VDD and a ground potential GND, respectively.

The memory cell 412 includes a first transistor 414, a second transistor 416, a third transistor 418, a fourth transistor 420, a fifth transistor 422, and a sixth transistor 424. The first transistor 414 and the second transistor 416 function as selection transistors. One of the third transistor 418 and the fourth transistor 420 is an n-channel transistor (here, the fourth transistor 420 is an n-channel transistor), and the other of the third transistor 418 and the fourth transistor 420 is a p-channel transistor (here, the third transistor 418 is a p-channel transistor). In other words, the third transistor 418 and the fourth transistor 420 form a CMOS circuit. Similarly, the fifth transistor 422 and the sixth transistor 424 form a CMOS circuit.

The first transistor 414, the second transistor 416, fourth transistor 420, and the sixth transistor 424 are n-channel transistors and the transistor described in Embodiment 1 may be applied to these transistors. Each of the third transistor 418 and the fifth transistor 422 is a p-channel transistor in which a channel formation region is formed using a material other than an oxide semiconductor. Note that one embodiment of the present invention is not limited thereto; the first transistor to the sixth transistor may be p-channel transistors described in Embodiment 1 or n-channel transistors including channel formation regions which are formed using a material other than an oxide semiconductor.

Embodiment 5

In this embodiment, an application example of the transistor described in Embodiment 1, which is different from the examples described in Embodiments 2 to 4, will be described. In this embodiment, a central processing unit (CPU) at least part of which includes the transistor described in Embodiment 1 will be described in this embodiment.

Figure 10A:
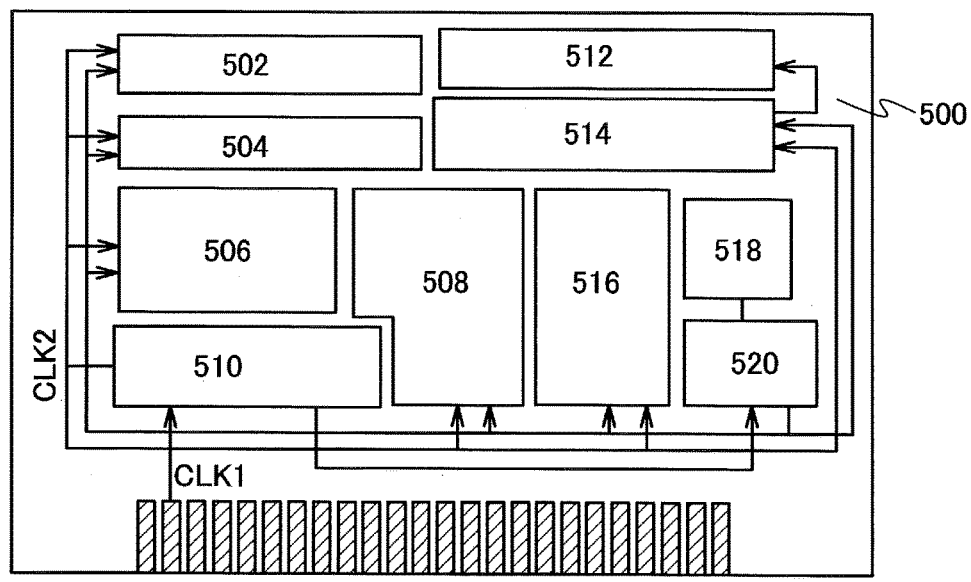
FIGS. 10A to 10C each illustrate a semiconductor device of one embodiment of the present invention.

FIG. 10A is a block diagram illustrating a specific structure of a CPU. The CPU illustrated in FIG. 10A includes an arithmetic logic unit (ALU) 502, an ALU controller 504, an instruction decoder 506, an interrupt controller 508, a timing controller 510, a register 512, a register controller 514, a bus interface (Bus I/F) 516, a rewritable ROM 518, and an ROM interface (ROM I/F) 520 over a substrate 500. A semiconductor substrate, an SOI substrate, a glass substrate, or the like can be used as the substrate 500. The ROM 518 and the ROM interface 520 may be provided over a separate chip. Obviously, the CPU illustrated in FIG. 10A is only an example in which the configuration is simplified, and an actual CPU may have various configurations depending on the application.

An instruction that is input to the CPU through the bus interface 516 is input to the instruction decoder 506 and decoded therein, and then, input to the ALU controller 504, the interrupt controller 508, the register controller 514, and the timing controller 510.

The ALU controller 504, the interrupt controller 508, the register controller 514, and the timing controller 510 conduct various controls in accordance with the decoded instruction. Specifically, the ALU controller 504 generates signals for controlling the operation of the ALU 502. While the CPU is executing a program, the interrupt controller 508 judges an interrupt request from an external input/output device or a peripheral circuit on the basis of its priority or a mask state, and processes the request. The register controller 514 generates an address of the register 512, and reads/writes data from/to the register 512 in accordance with the state of the CPU.

The timing controller 510 generates signals for controlling operation timings of the ALU 502, the ALU controller 504, the instruction decoder 506, the interrupt controller 508, and the register controller 514. For example, the timing controller 510 includes an internal clock generator for generating an internal clock signal CLK2 based on a reference clock signal CLK1, and supplies the clock signal CLK2 to the above circuits.

In the CPU illustrated in FIG. 10A, a memory cell is provided in the register 512. The memory cell described in any of Embodiments 2 to 4 can be used as the memory cell provided in the register 512.

In the CPU illustrated in FIG. 10A, the register controller 514 selects an operation of holding data in the register 512 in accordance with an instruction from the ALU 502. That is, the register controller 514 selects whether data is held by a phase-inversion element or a capacitor in the memory element included in the register 512. When data holding by the phase-inversion element is selected, power supply voltage is supplied to the memory element in the register 512. When data holding by the capacitor is selected, the data is rewritten in the capacitor, and supply of power supply voltage to the memory element in the register 512 can be stopped.

Figure 10B:
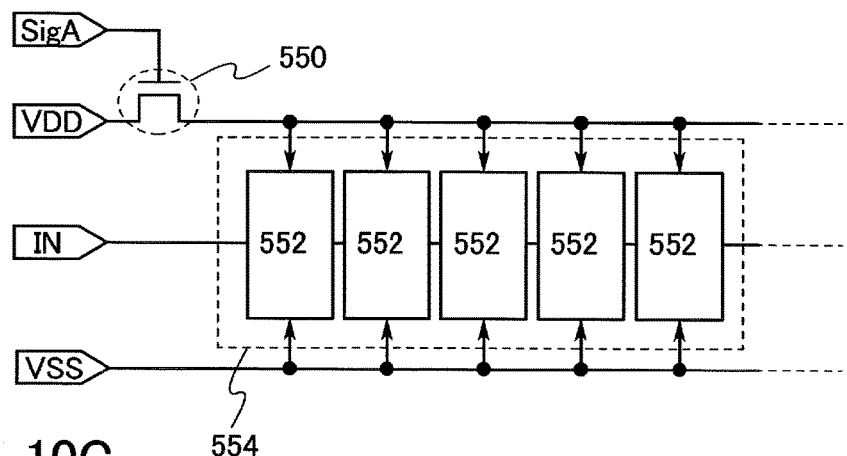
Figure 10C:
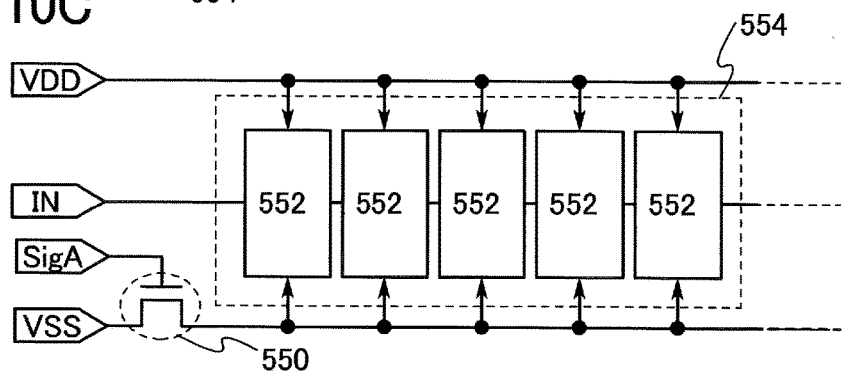

The power supply can be stopped by providing a switching element between a memory element group and a node to which a power supply potential VDD or a power supply potential VSS is supplied, as illustrated in FIG. 10B or FIG. 10C.

FIGS. 10B and 10C each illustrate an example of a configuration of a memory circuit including the transistor described in Embodiment 1 as a switching element for controlling supply of a power supply potential to a memory element.

The memory device illustrated in FIG. 10B includes a switching element 550 and a memory element group 554 including a plurality of memory elements 552. Specifically, as each of the memory elements 552, the memory element described in any of Embodiments 2 to 4 can be used. Each of the memory elements 552 included in the memory element group 554 is supplied with the high-level power supply potential VDD via the switching element 550. Further, each of the memory elements 552 included in the memory element group 554 is supplied with a potential of a signal IN and the low-level power supply potential VSS.

In FIG. 10B, the transistor described in Embodiment 1 is used for the switching element 550, and the switching of the transistor is controlled by a signal SigA supplied to a gate electrode thereof.

Note that FIG. 10B illustrates the configuration in which the switching element 550 includes only one transistor; however, the switching element 550 may include a plurality of transistors. In the case where the switching element 550 includes a plurality of transistors which serve as switching elements, the plurality of transistors may be connected to each other in parallel, in series, or in combination of parallel connection and series connection.

Although the switching element 550 controls the supply of the high-level power supply potential VDD to each of the memory elements 552 included in the memory element group 554 in FIG. 10B, the switching element 550 may control the supply of the low-level power supply potential VSS.

In FIG. 10C, an example of a memory device in which each of the memory elements 552 included in the memory element group 554 is supplied with the low-level power supply potential VSS via the switching element 550 is illustrated. The supply of the low-level power supply potential VSS to each of the memory elements 552 included in the memory element group 554 can be controlled by the switching element 550.

When a switching element is provided between the memory element group 554 and a node to which the power supply potential VDD or the power supply potential VSS is supplied, data can be held even in the case where an operation of a CPU is temporarily stopped and the supply of the power supply voltage is stopped; accordingly, power consumption can be reduced.

Although the CPU is given as an example, the transistor can also be applied to an LSI such as a digital signal processor (DSP), a custom LSI, or a field programmable gate array (FPGA).

Embodiment 6

In this embodiment, a display device to which the transistor described in Embodiment 1 is applied will be described.

Figure 11A:
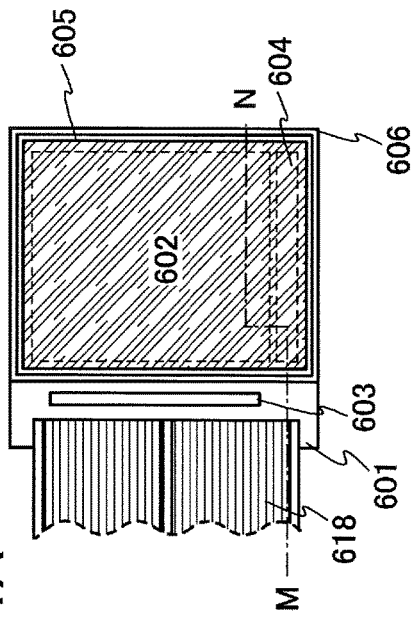
FIGS. 11A and 11B illustrate a semiconductor device of one embodiment of the present invention.
Figure 11B:
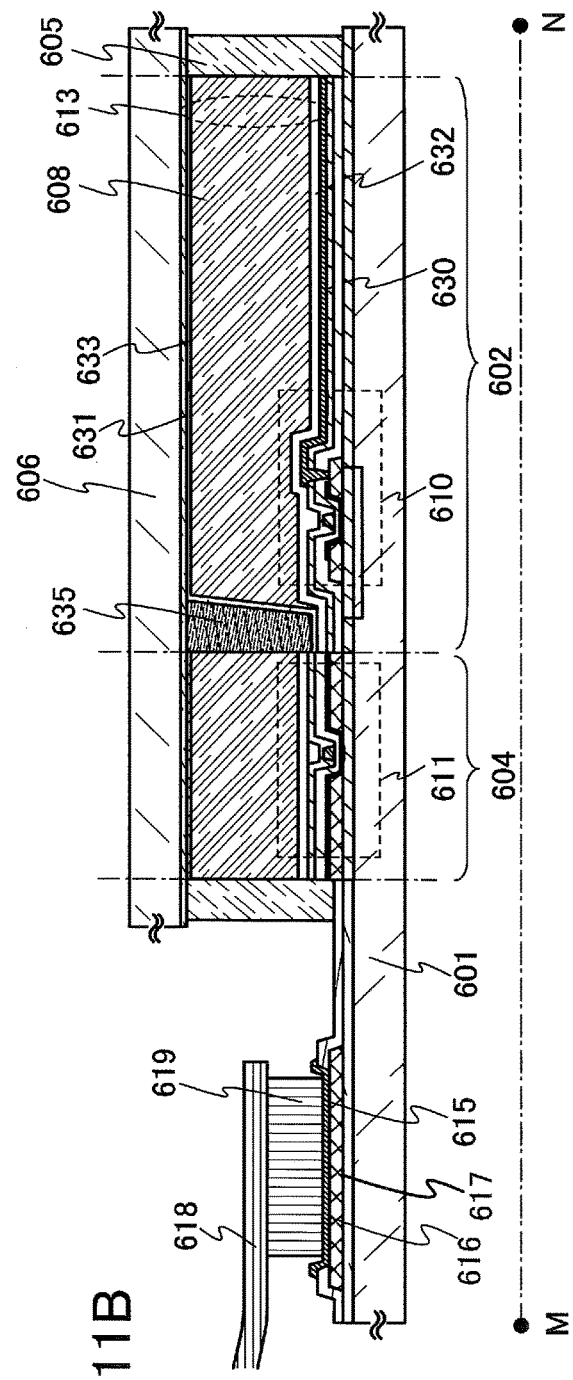

FIGS. 11A and 11B illustrate a liquid crystal display device to which the transistor described in Embodiment 1 is applied. FIG. 11B is a cross-sectional view taken along a line M-N in FIG. 11A. In FIG. 11A, a sealant 605 is provided so as to surround a pixel portion 602 and a scan line driver circuit 604 which are provided over a first substrate 601. A second substrate 606 is provided over the pixel portion 602 and the scan line driver circuit 604. Consequently, the pixel portion 602 and the scan line driver circuit 604 are sealed together with a display element such as a liquid crystal element, by the first substrate 601, the sealant 605, and the second substrate 606. In FIG. 11A, a signal line driver circuit 603 which is formed using a single crystal semiconductor film or a polycrystalline semiconductor film over another substrate is mounted in a region that is different from the region surrounded by the sealant 605 over the first substrate 601. In FIG. 11A, various signals and potentials are supplied to the signal line driver circuit 603 which is separately formed, the scan line driver circuit 604, and the pixel portion 602 from a flexible printed circuit (FPC) 618.

Although FIG. 11A illustrates the example in which the scan line driver circuit 604 is provided over the first substrate 601 and the signal line driver circuit 603 is provided separately and mounted on the first substrate 601, one embodiment of the present invention is not limited to this structure. The scan line driver circuit may be separately formed and then mounted, or part of the signal line driver circuit or part of the scan line driver circuit may be separately formed and then mounted.

A connection method of a separately formed driver circuit is not particularly limited; a chip on glass (COG) method, a wire bonding method, a tape automated bonding (TAB) method, or the like can be used. FIG. 11A illustrates the example in which the signal line driver circuit 603 is mounted by a COG method.

The display device includes in its category a panel with a display element sealed and a module with an IC or the like including a controller mounted on the panel.

Note that the display device in this specification also means an image display device, a display device, or a light source (including a lighting device). Further, the display device also includes in its category the following modules: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. A display medium whose contrast is changed by an electric effect, such as electronic ink, can be used as well.

As illustrated in FIG. 11B, the semiconductor device includes a connection terminal electrode 615 and a terminal electrode 616. The connection terminal electrode 615 and the terminal electrode 616 are electrically connected to a terminal provided for the FPC 618 via an anisotropic conductive film 619. Note that an oxide semiconductor film 617 remains below the terminal electrode 616.

The connection terminal electrode 615 is formed using the same conductive film as a first electrode 630, and the terminal electrode 616 is formed using the same conductive film as source and drain electrodes of transistors 610 and 611.

Each of the pixel portion 602 and the scan line driver circuit 604 which are provided over the first substrate 601 includes a plurality of transistors. In FIG. 11B, the transistor 610 included in the pixel portion 602 and the transistor 611 included in the scan line driver circuit 604 are illustrated as an example.

In this embodiment, the transistor described in Embodiment 1 can be applied to the transistor 610 and the transistor 611.

The transistor 610 included in the pixel portion 602 is electrically connected to the display element, which is included in a display panel. There is no particular limitation on the kind of the display element and various kinds of display elements can be employed.

An example of a liquid crystal display device using a liquid crystal element as a display element is described in FIG. 11B. In FIG. 11B, a liquid crystal element 613 which is a display element includes the first electrode 630, a second electrode 631, and a liquid crystal layer 608. Insulating films 632 and 633 serving as alignment layers are provided so that the liquid crystal layer 608 is provided therebetween. The second electrode 631 is provided on the second substrate 606 side, and the first electrode 630 and the second electrode 631 are stacked with the liquid crystal layer 608 provided therebetween.

A spacer 635 is a columnar spacer obtained by selective etching of an insulating film and is provided in order to adjust the thickness (a cell gap) of the liquid crystal layer 608. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

The specific resistivity of the liquid crystal material is $1\times10^9$ Ω·cm or more, preferably $1\times10^{11}$ Ω·cm or more, more preferably $1\times10^{12}$ Ω·cm or more. The value of the specific resistivity in this specification is measured at 20° C.

The size of a storage capacitor provided in the liquid crystal display device is set considering the leakage current of the transistor provided in the pixel portion or the like so that a charge can be held for a predetermined period. By using a transistor including a highly purified oxide semiconductor film, it is enough to provide a storage capacitor having a capacitance that is less than or equal to ⅓, preferably less than or equal to ⅕ of a liquid crystal capacitance of each pixel.

The transistor described in Embodiment 1 which is used in this embodiment can have low off-state current. Therefore, an electrical signal such as an image signal can be held for a long period, and a writing interval can be set long when the power is on. Accordingly, frequency of refresh operation can be reduced, which leads to an advantageous effect of suppressing power consumption.

The field-effect mobility of the transistor described in Embodiment 1 which is used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

Here, driving methods of a liquid crystal which can be applied to the liquid crystal display device of this embodiment are described. Driving methods of a liquid crystal include a vertical electric field method where a voltage is applied perpendicularly to a substrate and a horizontal electric field method where a voltage is applied parallel to a substrate.

First, FIGS. 12A1 and 12A2 are cross-sectional schematic views illustrating a pixel structure of a TN-mode liquid crystal display device.

A layer 700 including a display element is held between a first substrate 701 and a second substrate 702 which are provided so as to face each other. A first polarizing plate 703 is formed on the first substrate 701 side, and a second polarizing plate 704 is formed on the second substrate 702 side. An absorption axis of the first polarizing plate 703 and an absorption axis of the second polarizing plate 704 are arranged in a cross-Nicol state.

Although not illustrated, a backlight and the like are provided outside the second polarizing plate 704. A first electrode 708 is provided on the first substrate 701 and a second electrode 709 is provided on the second substrate 702. The first electrode 708 on the opposite side to the backlight, that is, on the viewing side, is formed to have a light-transmitting property.

In the case where the liquid crystal display device having such a structure is in a normally white mode, when a voltage is applied between the first electrode 708 and the second electrode 709 (referred to as a vertical electric field method), liquid crystal molecules 705 are aligned vertically as illustrated in FIG. 12A1. Thus, light from the backlight cannot reach the outside of the first polarizing plate 703, which leads to black display.

When no voltage is applied between the first electrode 708 and the second electrode 709, the liquid crystal molecules 705 are aligned horizontally and twisted on a plane surface as illustrated in FIG. 12A2. As a result, light from the backlight can reach the outside of the first polarizing plate 703, which leads to white display. In addition, adjustment of a voltage applied between the first electrode 708 and the second electrode 709 makes a gray scale possible. In this manner, a predetermined image is displayed.

Providing color filters, full color display can be performed. The color filters can be placed on either the first substrate 701 side or the second substrate 702 side.

A known liquid crystal material may be used for a TN-mode liquid crystal display device.

FIGS. 12B1 and 12B2 are cross-sectional schematic views illustrating a pixel structure of a VA-mode liquid crystal display device. In the VA mode, the liquid crystal molecules 705 are aligned to be vertical to the substrate when there is no electric field.

As in FIGS. 12A1 and 12A2, the first electrode 708 is provided on the first substrate 701 and the second electrode 709 is provided on the second substrate 702. The first electrode 708 on the opposite side to the backlight, that is, on the viewing side, is formed to have a light-transmitting property. The first polarizing plate 703 is formed on the first substrate 701 side, and the second polarizing plate 704 is formed on the second substrate 702 side. The absorption axis of the first polarizing plate 703 and the absorption axis of the second polarizing plate 704 are arranged in a cross-Nicol state.

In the liquid crystal display device having such a structure, when a voltage is applied between the first electrode 708 and the second electrode 709 (the vertical electric field method), the liquid crystal molecules 705 are aligned horizontally as illustrated in FIG. 12B1. Thus, light from the backlight can reach the outside of the first polarizing plate 703, which leads to white display.

When no voltage is applied between the first electrode 708 and the second electrode 709, the liquid crystal molecules 705 are aligned vertically as illustrated in FIG. 12B2. As a result, light from the backlight which is polarized by the second polarizing plate 704 passes through a cell without being influenced by birefringence of the liquid crystal molecules 705. Thus, the polarized light from the backlight cannot reach the outside of the first polarizing plate 703, which leads to black display. In addition, adjustment of a voltage applied between the first electrode 708 and the second electrode 709 makes a gray scale possible. In this manner, a predetermined image is displayed.

Providing color filters, full color display can be performed. The color filters can be placed on either the first substrate 701 side or the second substrate 702 side.

FIGS. 12C1 and 12C2 are cross-sectional schematic views illustrating a pixel structure of an MVA-mode liquid crystal display device. The MVA mode is a method in which one pixel is divided into a plurality of portions, and the portions have different alignment directions of the liquid crystal molecules 705 and compensate the viewing angle dependencies with each other. As illustrated in FIG. 12C1, in the MVA mode, a protrusion 758 whose cross section is a triangle is provided on the first electrode 708 and a protrusion 759 whose cross section is a triangle is provided on the second electrode 709 for controlling alignment. Note that the structures other than the protrusions are in common with the structures in the VA mode.

When a voltage is applied between the first electrode 708 and the second electrode 709 (the vertical electric field method), the liquid crystal molecules 705 are aligned so that a long axis of the liquid crystal molecule 705 is substantially vertical to surfaces of the projections 758 and 759 as illustrated in FIG. 12C1. Thus, light from the backlight can reach the outside of the first polarizing plate 703, which leads to white display.

When no voltage is applied between the first electrode 708 and the second electrode 709, the liquid crystal molecules 705 are aligned horizontally as illustrated in FIG. 12C2. As a result, light from the backlight cannot reach the outside of the first polarizing plate 703, which leads to black display. In addition, adjustment of a voltage applied between the first electrode 708 and the second electrode 709 makes a gray scale possible. In this manner, a predetermined image is displayed.

Providing color filters, full color display can be performed. The color filters can be placed on either the first substrate 701 side or the second substrate 702 side.

Figure 15A:
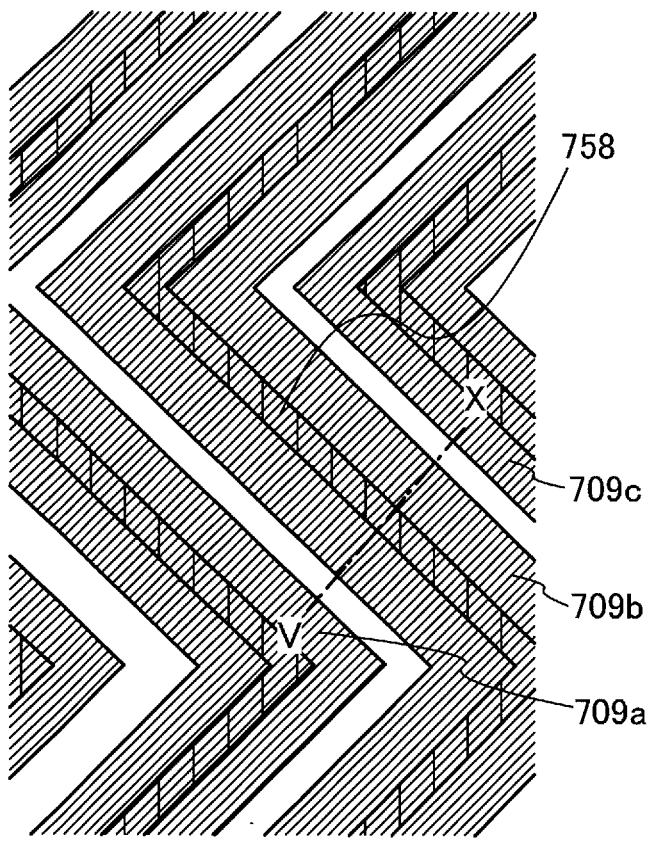
FIGS. 15A and 15B illustrate a semiconductor device of one embodiment of the present invention.
Figure 15B:
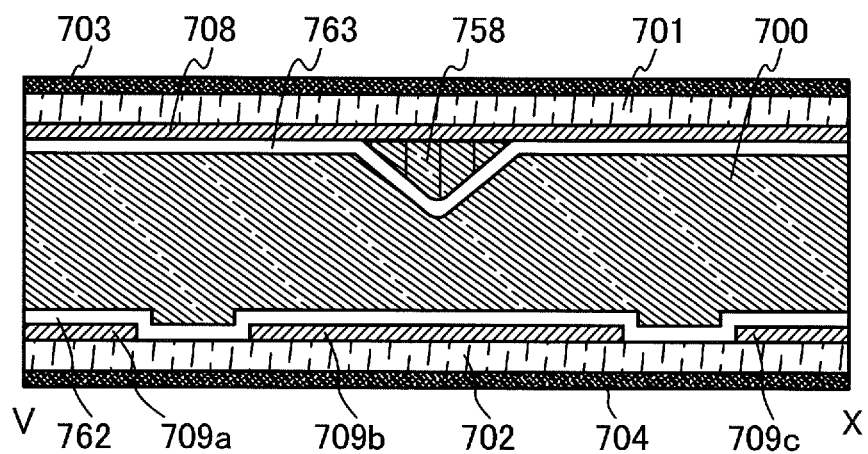

FIGS. 15A and 15B are a top view and a cross-sectional view, respectively, of another example of the MVA mode. In FIG. 15A, a second electrode 709a, a second electrode 709b, and a second electrode 709c are formed into a bent pattern of a dogleg-like shape. As illustrated in FIG. 15B, an insulating layer 762 that is an alignment film is formed over the second electrodes 709a, 709b, and 709c. The protrusion 758 is formed on the first electrode 708 and over the second electrode 709b. An insulating layer 763 that is an alignment film is formed over the first electrode 708 and the protrusion 758.

FIGS. 13A1 and 13A2 are cross-sectional schematic views illustrating a pixel structure of an OCB-mode liquid crystal display device. In the OCB mode, the liquid crystal molecules 705 in a liquid crystal layer are aligned so that they compensate viewing angle dependence (bend alignment).

As in FIGS. 12A1, 12A2, 12B1, 12B2, 12C1, and 12C2, the first electrode 708 is provided on the first substrate 701 and the second electrode 709 is provided on the second substrate 702. The first electrode 708 on the opposite side to the backlight, that is, on the viewing side, is formed to have a light-transmitting property. The first polarizing plate 703 is formed on the first substrate 701 side, and the second polarizing plate 704 is formed on the second substrate 702 side. The absorption axis of the first polarizing plate 703 and the absorption axis of the second polarizing plate 704 are arranged in a cross-Nicol state.

In the liquid crystal display device having such a structure, when a certain voltage is applied to the first electrode 708 and the second electrode 709 (the vertical electric field method), black display is performed. At that time, liquid crystal molecules 705 are aligned vertically as illustrated in FIG. 13A1. Thus, light from the backlight cannot reach the outside of the first polarizing plate 703, which leads to black display.

When no voltage is applied between the first electrode 708 and the second electrode 709, the liquid crystal molecules 705 are in a bend alignment state as illustrated in FIG. 13A2. As a result, light from the backlight can reach the outside of the first polarizing plate 703, which leads to white display. In addition, adjustment of a voltage applied between the first electrode 708 and the second electrode 709 makes a gray scale possible. In this manner, a predetermined image is displayed.

Providing color filters, full color display can be performed. The color filters can be placed on either the first substrate 701 side or the second substrate 702 side.

In the OCB mode, alignment of the liquid crystal molecules 705 in a liquid crystal layer can be compensated viewing angle dependency. In addition, a contrast ratio can be increased by a pair of stacked layers including polarizers.

FIGS. 13B1 and 13B2 are cross-sectional schematic views illustrating pixel structures of an FLC-mode liquid crystal display device and an AFLC-mode liquid crystal display device.

As in FIGS. 12A1, 12A2, 12B1, 12B2, 12C1, and 12C2, the first electrode 708 is provided on the first substrate 701 and the second electrode 709 is provided on the second substrate 702. The first electrode 708 on the opposite side to the backlight, that is, on the viewing side, is formed to have a light-transmitting property. The first polarizing plate 703 is formed on the first substrate 701 side, and the second polarizing plate 704 is formed on the second substrate 702 side. The absorption axis of the first polarizing plate 703 and the absorption axis of the second polarizing plate 704 are arranged in a cross-Nicol state.

In the liquid crystal display device having such a structure, when a voltage is applied to the first electrode 708 and the second electrode 709 (the vertical electric field method), the liquid crystal molecules 705 are aligned horizontally in a direction deviated from a rubbing direction. Thus, light from the backlight can reach the outside of the first polarizing plate 703, which leads to white display.

When no voltage is applied between the first electrode 708 and the second electrode 709, the liquid crystal molecules 705 are aligned horizontally along the rubbing direction as shown in FIG. 13B2. As a result, light from the backlight cannot reach the outside of the first polarizing plate 703, which leads to black display. In addition, adjustment of a voltage applied between the first electrode 708 and the second electrode 709 makes a gray scale possible. In this manner, a predetermined image is displayed.

Providing color filters, full color display can be performed. The color filters can be placed on either the first substrate 701 side or the second substrate 702 side.

A known liquid crystal material may be used for the FLC-mode liquid crystal display device and the AFLC-mode liquid crystal display device.

FIGS. 14A1 and 14A2 are cross-sectional schematic views each illustrating a pixel structure of an IPS-mode liquid crystal display device. In the IPS mode, liquid crystal molecules 705 are rotated constantly on a plane surface with respect to a substrate, and a horizontal electric field method in which electrodes are provided only on one substrate side is employed.

The IPS mode is characterized in that liquid crystals are controlled by a pair of electrodes which is provided on one substrate. Therefore, a pair of electrodes 750 and 751 is provided over the second substrate 702. The pair of electrodes 750 and 751 preferably has a light transmitting property. The first polarizing plate 703 is formed on the first substrate 701 side and the second polarizing plate 704 is formed on the second substrate 702 side. The absorption axis of the first polarizing plate 703 and the absorption axis of the second polarizing plate 704 are arranged in a cross-Nicol state.

When a voltage is applied between the pair of electrodes 750 and 751 in the liquid crystal display device having such a structure, the liquid crystal molecules 705 are aligned along a line of electric force which is deviated from the rubbing direction, as illustrated in FIG. 14A1. As a result, light from the backlight can reach the outside of the first polarizing plate 703, and white is displayed.

When no voltage is applied between the pair of electrodes 750 and 751, the liquid crystal molecules 705 are aligned horizontally along the rubbing direction, as illustrated in FIG. 14A2. As a result, light from the backlight cannot reach the outside of the first polarizing plate 703, and black is displayed. In addition, adjustment of a voltage applied between the pair of electrodes 750 and 751 makes a gray scale possible. In this manner, a predetermined image is displayed.

Providing color filters, full color display can be performed. The color filters can be placed on either the first substrate 701 side or the second substrate 702 side.

Figure 16A:
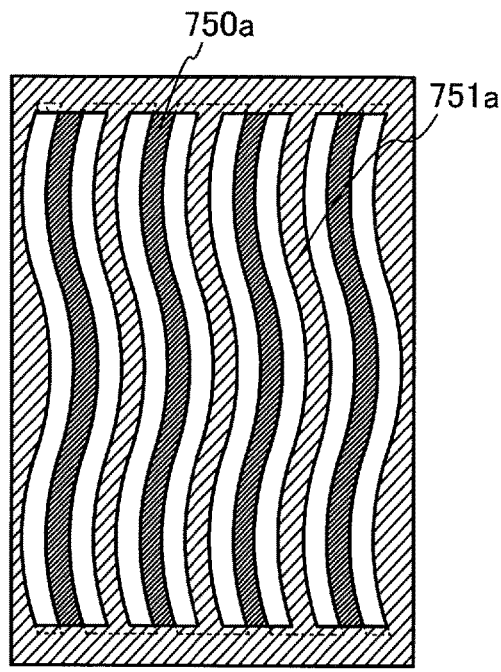
FIGS. 16A to 16C each illustrate a semiconductor device of one embodiment of the present invention.
Figure 16B:
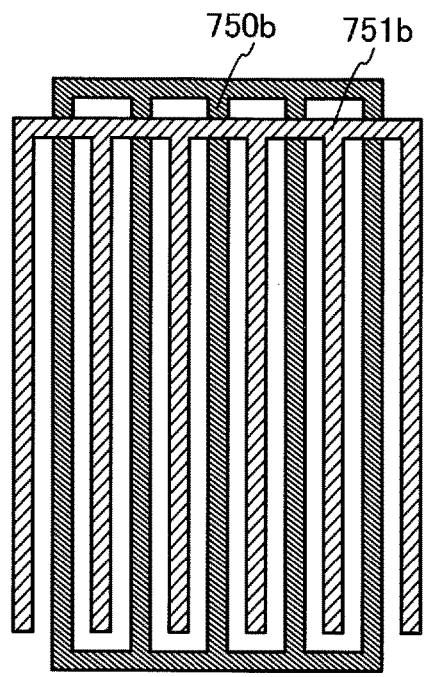
Figure 16C:
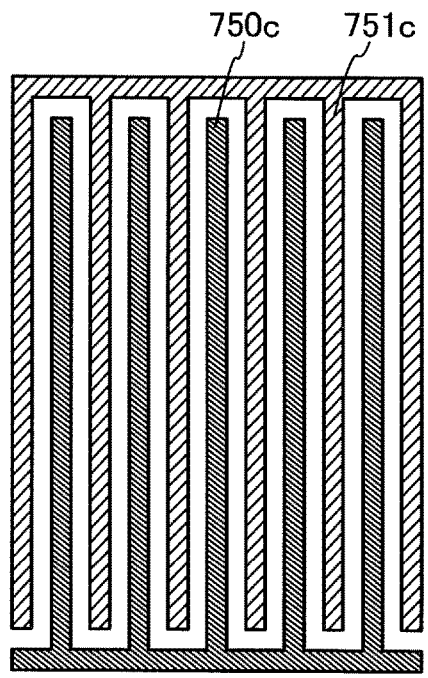

FIGS. 16A to 16C each illustrate an example of the pair of electrodes 750 and 751 that can be used in the IPS mode. As illustrated in top views of FIGS. 16A to 16C, the pair of electrodes 750 and 751 are alternatively formed. In FIG. 16A, electrodes 750a and 751a have an undulating wave shape. In FIG. 16B, electrodes 750b and 751b each have a comb-like shape and partly overlap with each other. In FIG. 16C, electrodes 750c and 751c have a comb-like shape in which the electrodes are meshed with each other.

FIGS. 14B1 and 14B2 are cross-sectional schematic views each illustrating a pixel structure of an FFS-mode liquid crystal display device. In the FFS mode, a vertical electric field method is employed similarly to the IPS mode; however the FES mode has a structure in which the electrode 751 is formed over the electrode 750 with an insulating film provided therebetween as illustrated in FIGS. 14B1 and 14B2.

The pair of electrodes 750 and 751 preferably has a light transmitting property. The first polarizing plate 703 is formed on the side of the first substrate 701 and the second polarizing plate 704 is formed on the side of the second substrate 702. The absorption axis of the first polarizing plate 703 and the absorption axis of the second polarizing plate 704 are arranged in a cross-Nicol state.

When a voltage is applied between the pair of electrodes 750 and 751 in a liquid crystal display device having such a structure, the liquid crystal molecules 705 are aligned along a line of electric force which is deviated from the rubbing direction, as illustrated in FIG. 14B1. As a result, light from the backlight can reach the outside of the first polarizing plate 703, and white is displayed.

When no voltage is applied between the pair of electrodes 750 and 751, the liquid crystal molecules 705 are aligned horizontally along the rubbing direction, as illustrated in FIG. 14B2. As a result, light from the backlight cannot reach the outside of the first polarizing plate 703, and black is displayed. In addition, adjustment of a voltage applied between the pair of electrodes 750 and 751 makes a gray scale possible. In this manner, a predetermined image is displayed.

Providing color filters, full color display can be performed. The color filters can be placed on either the first substrate 701 side or the second substrate 702 side.

Figure 17A:
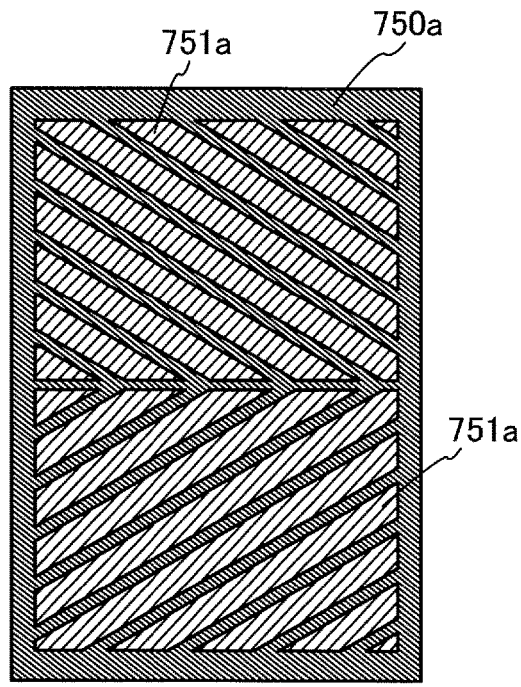
FIGS. 17A to 17C each illustrate a semiconductor device of one embodiment of the present invention.
Figure 17B:
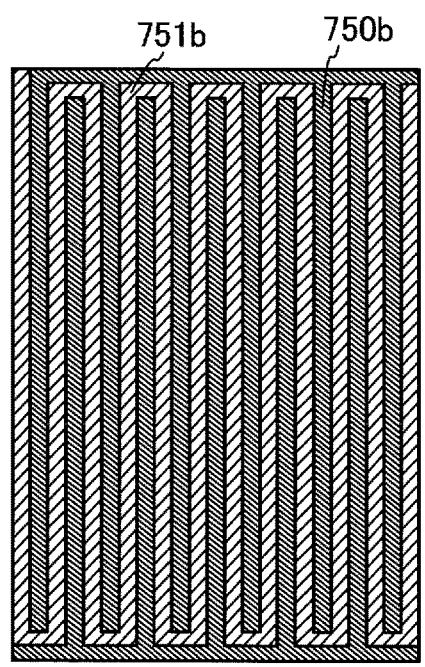
Figure 17C:
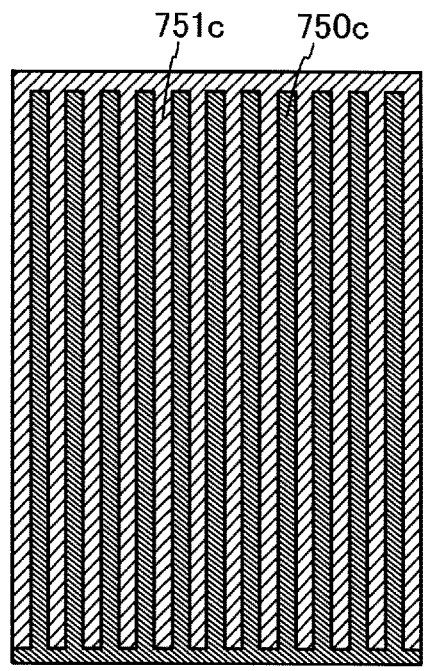

FIGS. 17A to 17C each show an example of the pair of electrodes 750 and 751 that can be used in the FFS mode. As illustrated in top views of FIGS. 17A to 17C, the electrodes 751 are formed into various patterns over the electrodes 750. In FIG. 17A, the electrode 751a over the electrode 750a has a bent dogleg-like shape. In FIG. 17B, the electrode 751b over the electrode 750b has a comb-like shape in which the electrodes are meshed with each other. In FIG. 17C, the electrode 751c over the electrode 750c has a comb-like shape.

A known material may be used for a liquid crystal material of the IPS mode and the FFS mode. Alternatively, a liquid crystal exhibiting a blue phase may be used.

Another operation mode such as a PVA mode, an ASM mode, or a TBA mode may be employed.

Figure 18A:
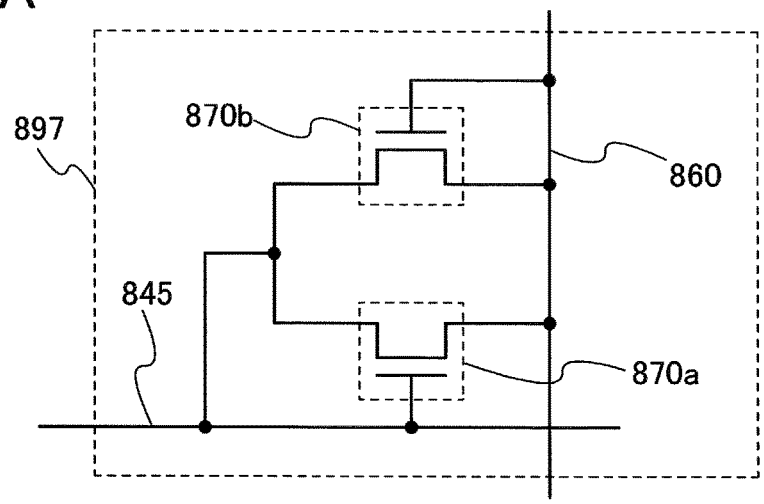
FIGS. 18A and 18B each illustrate a semiconductor device of one embodiment of the present invention.

The liquid crystal display device of this embodiment is preferably provided with a protection circuit. An example of a circuit that can be applied to the protection circuit is illustrated in FIG. 18A. A protection circuit 897 includes transistors 870a and 870b which are n-channel transistors. Each gate terminal of the transistors 870a and 870b is electrically connected to each drain terminal to have similar characteristics as a diode. The transistor described in Embodiment 1 may be used as the transistors 870a and 870b.

A first terminal (a gate) and a third terminal (a drain) of the transistor 870a are electrically connected to a first wiring 845 and a second terminal (a source) of the transistor 870a is electrically connected to a second wiring 860. A first terminal (a gate) and a third terminal (a drain) of the transistor 870b are electrically connected to the second wiring 860 and a second terminal (a source) of the transistor 870b is electrically connected to the first wiring 845. That is, the protection circuit illustrated in FIG. 18A includes two transistors whose rectifying directions are opposite to each other and each of which is electrically connected to the first wiring 845 and the second wiring 860. In other words, the protection circuit includes the transistor whose rectifying direction is from the first wiring 845 to the second wiring 860 and the transistor whose rectifying direction is from the second wiring 860 to the first wiring 845, between the first wiring 845 and the second wiring 860.

When the protection circuit 897 is provided, in the case where the second wiring 860 is positively or negatively charged due to static electricity or the like, current flows in a direction in which the charge is cancelled. For example, in the case where the second wiring 860 is positively charged, current flows in a direction in which the positive charge is released to the first wiring 845. Owing to this operation, electrostatic breakdown or malfunctions of a circuit or an element electrically connected to the charged second wiring 860 can be prevented. In the structure in which the charged second wiring 860 and another wiring intersect with an insulating layer interposed therebetween, this operation can further prevent dielectric breakdown of the insulating layer.

Note that the protection circuit is not limited to the above structure. For example, the protection circuit may include a plurality of transistors whose rectifying direction is from the first wiring 845 to the second wiring 860 and a plurality of transistors whose rectifying direction is from the second wiring 860 to the first wiring 845. In addition, a protection circuit can be configured using an odd number of transistors.

The protection circuit shown in FIG. 18A as an example can be applied to various uses. For example, the first wiring 845 is used as a common wiring of a display device, the second wiring 860 is used as one of a plurality of signal lines, and the protection circuit can be provided therebetween. A pixel transistor electrically connected to the signal line which is provided with the protection circuit is protected from malfunctions, such as electrostatic breakdown due to charged wirings, a shift in threshold voltage, and the like. The protection circuit can be applied to other parts of the display circuit as well as other circuits such as the reading circuit described in Embodiment 2.

Figure 18B:
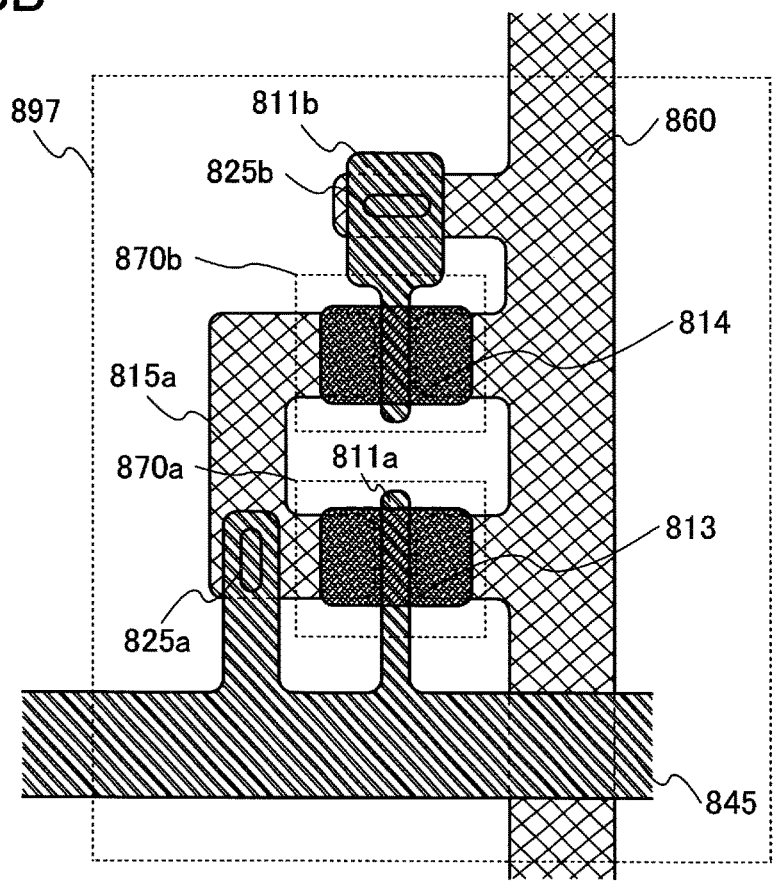

Next, an example in which the protection circuit 897 is formed over a substrate will be described. An example of a top view of the protection circuit 897 is shown in FIG. 18B.

The transistor 870a includes a gate electrode 811a and the gate electrode 811a is electrically connected to the first wiring 845. The source electrode of the transistor 870a is electrically connected to the second wiring 860 and the drain electrode of the transistor 870a is electrically connected to the first wiring 845 through a first electrode 815a. In addition, the transistor 870a includes a semiconductor layer 813 overlapping with the gate electrode 811a between the source electrode and the drain electrode.

The transistor 870b includes a gate electrode 811b and the gate electrode 811b is electrically connected to the second wiring 860 through a contact hole 825b. The drain electrode of the transistor 870b is electrically connected to the second wiring 860 and the source electrode of the transistor 870b is electrically connected to the first wiring 845 through the first electrode 815a and a contact hole 825a. In addition, the transistor 870b includes a semiconductor layer 814 overlapping with the gate electrode 811b between the source electrode and the drain electrode.

As described in detail in this embodiment, the transistor described in Embodiment 1 can be applied to a liquid crystal display device.

Note that a display device of a semiconductor device of one embodiment of the present invention is not limited to a liquid crystal display device; an EL display device in which a light-emitting element is provided as a display element may be used.

In the case where a light-emitting element is used as a display element, a pixel configuration in which light emission/non-light emission of the light-emitting element is controlled by a transistor may be employed. For example, a configuration in which a pixel is provided with a driver transistor and a current control transistor may be employed. At this time, the transistor described in Embodiment 1 may be applied to both the driver transistor and the current control transistor or may be applied to one of the driver transistor and the current control transistor. In the case where the transistor described in Embodiment 1 is applied to one of the driver transistor and the current control transistor, a transistor in which a channel formation region is formed using a material other than an oxide semiconductor may be applied to the other of the driver transistor and the current control transistor.

Embodiment 7

In this embodiment, electronic devices of embodiments of the present invention will be described. At least part of the electronic devices of embodiments of the present invention is provided with the transistor described in Embodiment 1. Examples of the electronic devices of embodiments of the present invention include a computer, a mobile phone (also referred to as a cellular phone or a mobile phone device), a personal digital assistant (including a portable game machine, an audio reproducing device, and the like), a digital camera, a digital video camera, electronic paper, and a television device (also referred to as a television or a television receiver). For example, the display device described in Embodiment 6 may be used as a pixel transistor for forming a display portion of such an electronic device.

Figure 19A:
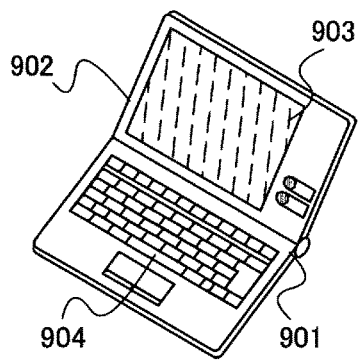
FIGS. 19A to 19F each illustrate a semiconductor device of one embodiment of the present invention.

FIG. 19A illustrates a laptop personal computer including a housing 901, a housing 902, a display portion 903, a keyboard 904, and the like. The transistor described in Embodiment 1 is provided in the housing 901 and the housing 902. The transistor described in Embodiment 1 is mounted on the laptop personal computer illustrated in FIG. 19A, whereby display unevenness of the display portion can be reduced and reliability can be improved.

Figure 19B:
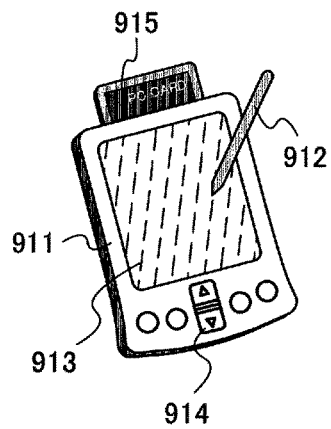

FIG. 19B illustrates a personal digital assistant (PDA) in which a main body 911 is provided with a display portion 913, an external interface 915, operation buttons 914, and the like. Further, a stylus 912 for operating the personal digital assistant or the like is provided. The transistor described in Embodiment 1 is provided in the main body 911. The transistor described in Embodiment 1 is mounted on the PDA illustrated in FIG. 19B, whereby display unevenness of the display portion can be reduced and reliability can be improved.

Figure 19C:
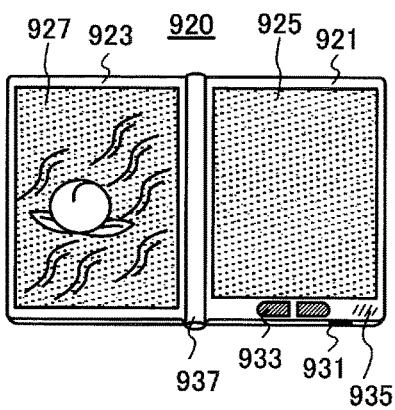

FIG. 19C illustrates an electronic book reader 920 including electronic paper. The electronic book reader 920 has two housings, a housing 921 and a housing 923. The housing 921 and the housing 923 are provided with a display portion 925 and a display portion 927, respectively. The housing 921 and the housing 923 are physically connected by a hinge 937 and can be opened and closed with the hinge 937 as an axis. Further, the housing 921 is provided with a power switch 931, operation keys 933, a speaker 935, and the like. At least one of the housings 921 and 923 is provided with the transistor described in Embodiment 1. The transistor described in Embodiment 1 is mounted on the electronic book reader illustrated in FIG. 19C, whereby display unevenness of the display portion can be reduced and reliability can be improved.

Figure 19D:
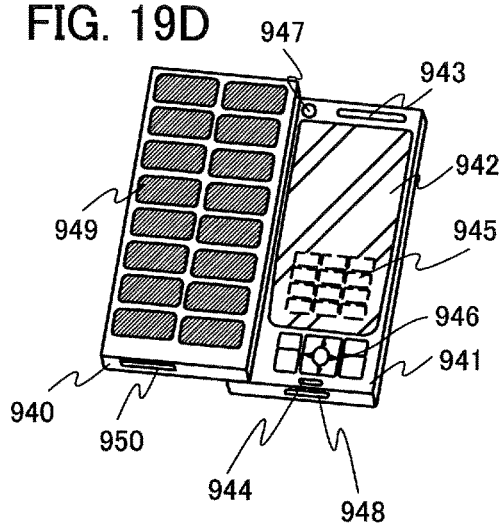

FIG. 19D illustrates a mobile phone including two housings, a housing 940 and a housing 941. Further, the housing 940 and the housing 941 in a state where they are developed as illustrated in FIG. 19D can shift by sliding so that one is lapped over the other; therefore, the size of the mobile phone can be reduced, which makes the mobile phone suitable for being carried. The housing 941 is provided with a display panel 942, a speaker 943, a microphone 944, a pointing device 946, a camera lens 947, an external connection terminal 948, and the like. The housing 940 is provided with a solar cell 949 that charges the mobile phone, an external memory slot 950, and the like. Note that an antenna is incorporated in the housing 941. At least one of the housings 940 and 941 is provided with the transistor described in Embodiment 1. The transistor described in Embodiment 1 is mounted on the mobile phone illustrated in FIG. 19D, whereby display unevenness of the display portion can be reduced and reliability can be improved.

Figure 19E:
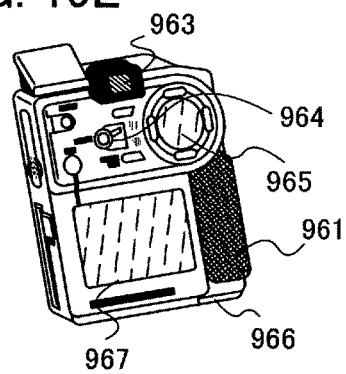

FIG. 19E illustrates a digital camera including a main body 961, a display portion 967, an eyepiece 963, an operation switch 964, a display portion 965, a battery 966, and the like. The transistor described in Embodiment 1 is provided in the main body 961. The transistor described in Embodiment 1 is mounted on the digital camera illustrated in FIG. 19E, whereby display unevenness of the display portion can be reduced and reliability can be improved.

Figure 19F:
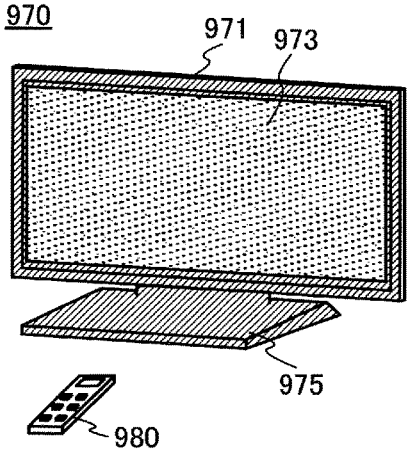

FIG. 19F is a television device 970 including a housing 971, a display portion 973, a stand 975, and the like. The television device 970 can be operated by an operation switch of the housing 971 or a separate remote controller 980. The housing 971 and the remote controller 980 are provided with the transistor described in Embodiment 1. The transistor described in Embodiment 1 is mounted on the television device illustrated in FIG. 19F, whereby display unevenness of the display portion can be reduced and reliability can be improved.

This application is based on Japanese Patent Application serial no. 2011-004422 filed with Japan Patent Office on Jan. 12, 2011, the entire contents of which are hereby incorporated by reference.

What is claimed is:

1. A method for manufacturing a semiconductor device, comprising the steps of:

forming a source electrode and a drain electrode;
forming an oxide semiconductor film over and in contact with the source electrode and the drain electrode;
patterning the oxide semiconductor film to form an oxide semiconductor layer;
forming a second insulating film covering the oxide semiconductor layer;
forming a gate electrode over the oxide semiconductor layer;
forming a third insulating film covering the second insulating film; and
performing a second heat treatment to the oxide semiconductor layer after forming the third insulating film,
wherein a part of oxygen in the third insulating film is desorbed during the second heat treatment, and
wherein a part of the desorbed oxygen is supplied to the oxide semiconductor layer.

2. The method according to claim 1, further comprising the steps of:

forming a first insulating film over a substrate, wherein the first insulating film is under the source electrode and the drain electrode; and
performing a first heat treatment to the oxide semiconductor film before the patterning the oxide semiconductor film.

3. The method according to claim 2, wherein a part of oxygen in the first insulating film is desorbed during the first heat treatment, and
wherein a part of the desorbed oxygen is supplied to the oxide semiconductor film.

4. The method according to claim 2, wherein the first insulating film is formed using an insulating oxide containing more oxygen than oxygen in a stoichiometric proportion.

5. The method according to claim 2, wherein the first heat treatment is performed by a heat treatment on the substrate.

6. The method according to claim 2, wherein a concentration of hydrogen in the oxide semiconductor film is lowered after performing the first heat treatment.

7. The method according to claim 1, wherein each of the source electrode and the drain electrode is a metal film having a thickness ranging from 100 nm to 300 nm.

8. The method according to claim 1, wherein the oxide semiconductor layer includes a region comprising c-axis-aligned crystalline oxide semiconductor that is a non-single-crystal oxide material.

* * * * *